(12) United States Patent
Matsugi et al.

(10) Patent No.: US 12,351,753 B2
(45) Date of Patent: Jul. 8, 2025

(54) COMPOSITE MATERIAL AND COMPOSITE MATERIAL MANUFACTURING METHOD

(71) Applicant: Sumitomo Electric Industries, Ltd., Osaka (JP)

(72) Inventors: Ryota Matsugi, Osaka (JP); Isao Iwayama, Osaka (JP); Tetsuya Kuwabara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1031 days.

(21) Appl. No.: 16/970,427

(22) PCT Filed: Feb. 18, 2019

(86) PCT No.: PCT/JP2019/005901
§ 371 (c)(1),
(2) Date: Aug. 17, 2020

(87) PCT Pub. No.: WO2019/163721
PCT Pub. Date: Aug. 29, 2019

(65) Prior Publication Data
US 2020/0370146 A1 Nov. 26, 2020

(30) Foreign Application Priority Data
Feb. 21, 2018 (JP) .................. 2018-029077

(51) Int. Cl.
*C09K 5/14* (2006.01)
*B22F 1/18* (2022.01)
(Continued)

(52) U.S. Cl.
CPC .............. *C09K 5/14* (2013.01); *B22F 1/18* (2022.01); *B22F 3/26* (2013.01); *C09C 1/44* (2013.01);
(Continued)

(58) Field of Classification Search
CPC ........................................ C09K 5/14
See application file for complete search history.

(56) References Cited

U.S. PATENT DOCUMENTS 5,783,316 A * 7/1998 Colella .................. C22C 26/00
428/323
6,031,285 A * 2/2000 Nishibayashi ...... H01L 23/3733
257/706

(Continued)

FOREIGN PATENT DOCUMENTS

| JP | 2004-197153 A | 7/2004 |
| JP | 2013-115096 A | 6/2013 |
| WO | WO-2016/035795 A1 | 3/2016 |

OTHER PUBLICATIONS

Kidalov et al. (Materials 2009, 2, 2467-2495) (Year: 2009).*

*Primary Examiner* — Liam J Heincer
(74) *Attorney, Agent, or Firm* — Faegre Drinker Biddle & Reath LLP

(57) ABSTRACT

A composite material includes: coated particles, each of which includes a carbon-based particle made of a carbon-based substance and a carbide layer that covers at least a part of the surface of the carbon-based particle; and a copper phase that binds the coated particles to each other, wherein the carbide layer is made of a carbide containing at least one element selected from the group consisting of Si, Ti, Zr and Hf, and the average particle size of the carbon-based particles is 1 μm or more and 100 μm or less.

6 Claims, 3 Drawing Sheets

(51) Int. Cl.
  *B22F 3/26* (2006.01)
  *C09C 1/44* (2006.01)
  *C22C 1/05* (2023.01)
  *C22C 1/10* (2023.01)
  *C22C 26/00* (2006.01)
  *H01L 23/373* (2006.01)

(52) U.S. Cl.
  CPC .......... *C22C 1/05* (2013.01); *C22C 1/10* (2013.01); *C22C 26/00* (2013.01); *C01P 2004/02* (2013.01); *C01P 2004/61* (2013.01); *C01P 2004/80* (2013.01); *C01P 2006/32* (2013.01); *H01L 23/373* (2013.01)

(56) References Cited

U.S. PATENT DOCUMENTS

| | | | | |
|---|---|---|---|---|
| 6,171,691 B1* | 1/2001 | Nishibayashi | | H01L 23/3732 428/323 |
| 6,264,882 B1* | 7/2001 | Colella | | C22C 26/00 427/532 |
| 2007/0042895 A1* | 2/2007 | Weber | | H01L 23/3732 257/E23.111 |
| 2010/0163782 A1* | 7/2010 | Chang | | C09K 5/14 252/71 |
| 2010/0319900 A1* | 12/2010 | Abyzov | | H01L 23/3732 204/192.15 |
| 2012/0164429 A1* | 6/2012 | Shah | | B82Y 30/00 428/293.1 |
| 2013/0221268 A1* | 8/2013 | Sung | | C09K 5/14 252/78.3 |
| 2016/0168440 A1* | 6/2016 | Verfuerth | | C09K 5/14 252/79 |
| 2016/0186031 A1* | 6/2016 | Zhao | | C04B 35/645 264/134 |
| 2017/0145280 A1* | 5/2017 | Morikawa | | H01L 23/3732 |
| 2020/0194334 A1* | 6/2020 | Robinson | | H01L 23/3732 |
| 2020/0370146 A1* | 11/2020 | Matsugi | | C22C 1/0475 |
| 2021/0381782 A1* | 12/2021 | Matsugi | | C22C 26/00 |
| 2022/0186347 A1* | 6/2022 | Iwayama | | C22C 29/06 |
| 2022/0216124 A1* | 7/2022 | He | | H01L 23/3737 |
| 2023/0126268 A1* | 4/2023 | Matsugi | | B22F 1/18 252/71 |
| 2023/0183541 A1* | 6/2023 | Cho | | C09K 5/14 428/663 |

* cited by examiner

COMPOSITE MATERIAL AND COMPOSITE MATERIAL MANUFACTURING METHOD

TECHNICAL FIELD

The present disclosure relates to a composite material and a composite material manufacturing method. The present application claims the benefit of priority to Japanese Patent Application No. 2018-029077 filed on Feb. 21, 2018, the entire contents of which are incorporated herein by reference.

BACKGROUND ART

PTL 1 discloses a composite material of diamond and metal as a material suitable for a heat sink (a heat dissipation member) of a semiconductor device. In the composite material, coated diamond particles including a carbide layer on the surface of each diamond particle are dispersed in an alloy (Ag—Cu alloy) of silver (Ag) and copper (Cu).

CITATION LIST

Patent Literature

PTL 1: Japanese Patent Laying-Open No. 2004-197153

SUMMARY OF INVENTION

A composite material of the present disclosure includes:
coated particles, each of which includes a carbon-based particle made of a carbon-based substance and a carbide layer that covers at least a part of the surface of the carbon-based particle; and
a copper phase that binds the coated particles to each other,
the carbide layer is made of a carbide containing at least one element selected from the group consisting of Si, Ti, Zr and Hf, and
the average particle size of the carbon-based particles is 1 μm or more and 100 μm or less.

A composite material manufacturing method of the present disclosure includes:
a step of forming a laminated body by laminating a first layer and a second layer; and
a step of heating the laminated body,
the first layer includes:
a first powder made of a carbon-based substance; and
a second powder made of at least one of a compound containing at least one element selected from the group consisting of Si, Ti, Zr and Hf, and the element itself,
the second layer includes:
a copper material consisting of Cu and inevitable impurities; and
the second powder,
in the heating step, the copper material is heated to a molten state under a vacuum atmosphere of 1 Pa or less, a reducing atmosphere or an inert atmosphere without pressurization, and compounded with the first powder.

DETAILED DESCRIPTION

Figure 1A:
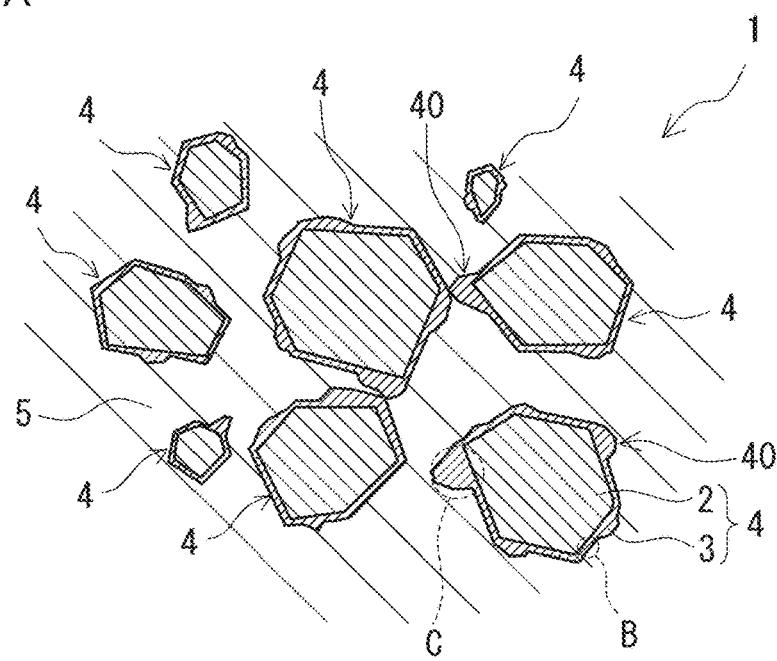
FIG. 1A is a view schematically illustrating a cross section of a composite material according to an embodiment.

Problem to be Solved by the Present Disclosure

As described above, as a material for a heat dissipation member such as a heat dissipation member of the semiconductor device, it is desired that the composite material is excellent in thermal characteristics and excellent in manufacturability. In particular, it is desired that the composite material initially has a high thermal conductivity when being used as a heat dissipation member, and has a small decrease in the thermal conductivity even when subjected to a thermal cycle so as to maintain the high thermal conductivity.

In the Ag—Cu alloy described in PTL 1, the Ag content is 72% by mass. This Ag—Cu alloy has a low melting point. Therefore, the infiltration temperature is low. As mentioned above, the Ag—Cu alloy contains a larger amount of Ag which has a higher thermal conductivity than Cu. Thus, the composite material containing such an Ag—Cu alloy may have a greater thermal conductivity. However, since the Ag—Cu alloy contains a larger amount of Ag which is heavier than Cu, the weight thereof become greater. Further, since the Ag—Cu alloy contains a larger amount of Ag which is expensive, the raw material cost is increased. Therefore, a composite material which contains no Ag but is excellent in thermal characteristics and excellent in manufacturability is desired.

Therefore, an object of the present disclosure is to provide a composite material excellent in thermal characteristics and excellent in manufacturability. Another object of the present disclosure is to provide a composite material manufacturing method capable of manufacturing a composite material excellent in thermal characteristics with high productivity.

Advantageous Effect of the Present Disclosure

The composite material according to the present disclosure is excellent in thermal characteristics and excellent in manufacturability. The composite material manufacturing method according to the present disclosure can manufacture a composite material excellent in thermal characteristics with high productivity.

DESCRIPTION OF EMBODIMENTS

First, a description will be given on each aspect of the present disclosure.

(1) The composite material according to an aspect of the present disclosure includes:
coated particles, each of which includes a carbon-based particle made of a carbon-based substance and a carbide layer that covers at least a part of the surface of the carbon-based particle; and
a copper phase that binds the coated particles to each other, the carbide layer is made of a carbide containing at least one element selected from the group consisting of Si, Ti, Zr and Hf, and the average particle size of the carbon-based particles is 1 µm or more and 100 µm or less.

Hereinafter, "at least one element selected from the group consisting of Si (silicon), Ti (titanium), Zr (zirconium), and Hf (hafnium)" may be referred to as "specific element" where appropriate.

To described below, the composite material of the present disclosure is excellent in thermal characteristics and excellent in manufacturability. Further, the composite material of the present disclosure is excellent in thermal characteristics, and has a linear expansion coefficient between that of the carbon-based substance and that of Cu (copper). Typically, the linear expansion coefficient of the composite material of the present disclosure is close to the linear expansion coefficient of the semiconductor device or the linear expansion coefficient of a peripheral component of the semiconductor device (such as an insulating substrate or the like). Therefore, the composite material of the present disclosure has excellent compatibility with the linear expansion coefficient of the semiconductor device and its peripheral components. The composite material of the present disclosure may be suitably used as a material for a heat dissipation member of the semiconductor device.

(Thermal Characteristics)

The composite material of the present disclosure is excellent in thermal conduction for the following reasons (a) to (c):

(a) The composite material of the present disclosure is mainly composed of carbon-based particles having a high thermal conductivity such as diamond or the like, and Cu having a high thermal conductivity.

(b) Typically, the coated particles are present in the copper phase in a dispersed state. Further, the carbon-based particles and the copper phase are adhered closely to each other via the carbide layer. Therefore, there are very few pores between the carbon-based particles and the copper phase. Therefore, it is possible to inhibit a decrease in heat transfer between the carbon-based particles and the copper phase due to the pores.

(c) The average particle size of the carbon-based particles is 1 µm or more, and thus the carbon-based particles are not too small. Therefore, it is possible to inhibit a decrease in thermal conductivity due to the reason that there are too many grain boundaries between the carbon-based particles in the composite material.

The composite material of the present disclosure has a small decrease in thermal conductivity even when subjected to a thermal cycle and maintains a high thermal conductivity, in other words, it is excellent in thermal cycle characteristics. One of the reasons is that the average particle size of the carbon-based particles is 100 µm or less, and thus the carbon-based particles are not too large. The detailed reasons will be described later.

(Manufacturability)

(d) The composite material of the present disclosure may be manufactured, for example, by a composite material manufacturing method which will be described below in (10). In the manufacturing process, the carbide layer is appropriately formed on the outer periphery of each carbon-based particle. This carbide layer is easily wetted with copper in molten state (hereinafter will be referred to as molten copper where appropriate). Therefore, the molten copper may be satisfactorily and spontaneously infiltrated into the carbon-based particles through the carbide layer.

(e) The composite material of the present disclosure is excellent in workability such as cutting or the like. This is because the average particle size of the carbon-based particles is not too large as described above. Therefore, it is possible to easily adjust the size and shape of the composite material by grinding or polishing the same in the manufacturing process.

(f) The metal phase contains Cu and inevitable impurities but contains no Ag. Therefore, it is possible to lower the raw material cost.

(2) As an example of the composite material of the present disclosure, according to an aspect, the maximum thickness of the carbide layer is 3 µm or less.

In the aspect mentioned above, the carbide layer, which is lower than the carbon-based substance and Cu in thermal conduction, is made thin. Therefore, it is possible to inhibit a decrease in thermal conductivity due to the carbide layer, which makes the composite material excellent in thermal conduction.

(3) As an example of the composite material of the present disclosure, according to an aspect, the coated particles include particles, at least a part of which encapsulates a copper component in a part of the carbide layer, the ratio of the total cross sectional area of the particles that encapsulate the copper component relative to the total cross sectional area of the coated particles in the cross section is 30% or more, and the total content of the copper component in the carbide layer of the particles that encapsulate the copper component is 1% by volume or more and 70% by volume or less.

In the aspect mentioned above, there are many coated particles containing the copper component which has a high thermal conductivity in the carbide layer which is lower than the carbon-based substance and Cu in thermal conduction. Therefore, according to the aspect mentioned above, it is possible to inhibit a large decrease in thermal conductivity due to the carbide layer. In particular, according to the aspect mentioned above, since the content of the copper component in the carbide layer is in the specific range mentioned above, the carbide containing the specific element and the copper component are well balanced. Therefore, according to the aspect mentioned above, the effect of improving thermal conduction due to the presence of the copper component and the effect of improving the wettability due to the carbide layer containing the specific element are well balanced, which makes the composite material excellent in thermal characteristics and excellent in manufacturability.

(4) As an example of the composite material of the present disclosure, according to an aspect, if a value obtained by dividing the contour length of the carbon-based particle by the circumferential length of an equivalent circle of the carbon-based particle in the cross section is defined as a degree of irregularity, the degree of irregularity is 1.2 or more.

If the carbon-based particles have the degree of irregularity of 1.2 or more, they may have a large contact area with the carbide layer. Since the carbon-based particles are firmly bonded to the carbide layer and thereby firmly bonded to the copper phase via the carbide layer, the interfacial strength between the carbon-based particles, the carbide layer and the copper phase is high. According to the aspect described above, the composite material is excellent in thermal cycle characteristics. Further, according to the aspect described above, since it is possible to inhibit the carbon particles from falling off when cutting the composite material in the manufacturing process, the composite material is excellent in manufacturability.

(5) As an example of the composite material of the present disclosure, according to an aspect, the content of the element in the copper phase is 1% by mass or less.

According to the aspect mentioned above, the copper phase contains few specific element that is lower in thermal conductivity than Cu. Therefore, it is possible to inhibit a decrease in thermal conductivity due to the presence of the specific element in the copper phase, which makes the composite material excellent in thermal conduction.

(6) As an example of the composite material of the present disclosure, according to an aspect, the carbon-based substance is one or more materials selected from the group consisting of diamond, graphite, carbon nanotubes, and carbon fibers.

Each of the carbon-based substances listed above has a high thermal conductivity depending on direction. Therefore, the composite material according to the aspect mentioned above is excellent in thermal conduction.

(7) As an example of the composite material of the present disclosure, according to an aspect, the content of the carbon-based particles in the composite material is 40% by volume or more and 85% by volume or less.

The composite material according to the aspect mentioned above is excellent in thermal conduction since it contains the carbon-based particles appropriately. Since there are not too many carbon-based particles in the manufacturing process, it is possible for the molten copper to be easily infiltrated into the carbon-based particles. Therefore, according to the aspect mentioned above, it is possible to inhibit the occurrence of non-infiltrated portions and the like, which makes the composite material excellent in manufacturability.

(8) As an example of the composite material of the present disclosure, according to an aspect, the composite material has a thermal conductivity of 200 W/mK or more. In the present disclosure, the thermal conductivity is measured at room temperature (about 5° C. to 25° C.) under atmospheric pressure.

Since the composite material according to the aspect mentioned above has a high thermal conductivity, it may be suitably used as a material for a heat dissipation member of a semiconductor device that requires high heat dissipation.

(9) As an example of the composite material of the present disclosure, according to an aspect, the composite material has a linear expansion coefficient of $4 \times 10^{-6}$/K or more and $15 \times 10^{-6}$/K or less. In the present disclosure, the linear expansion coefficient is measured in the range of 30° C. to 800° C.

Since the composite material according to the above aspect has excellent compatibility with the linear expansion coefficient of the semiconductor device and the linear expansion coefficient of the peripheral components of the semiconductor device, it may be suitably used as a material for a heat dissipation member of the semiconductor device.

(10) A composite material manufacturing method according to an aspect of the present disclosure includes:
  a step of forming a laminated body by laminating a first layer and a second layer; and
  a step of heating the laminated body,
  the first layer includes:
    a first powder made of a carbon-based substance; and
    a second powder made of at least one of a compound containing at least one element selected from the group consisting of Si, Ti, Zr and Hf, and the element itself,
  the second layer includes:
    a copper material consisting of Cu and inevitable impurities; and
    the second powder,
  in the heating step, the copper material is heated to a molten state under a vacuum atmosphere of 1 Pa or less, a reducing atmosphere or an inert atmosphere without pressurization, and compounded with the first powder.

As to be described hereinafter, the composite material manufacturing method according to the present disclosure can manufacture a composite material excellent in thermal characteristics with high productivity.

(Thermal Characteristics)

In the composite material manufacturing method of the present disclosure, a carbon-based substance having a high thermal conductivity such as diamond or the like and Cu having a high thermal conductivity are used as raw materials to manufacture a composite material mainly composed of the carbon-based substance and Cu. The composite material is excellent in thermal conduction.

In particular, for the following reasons (A) and (B), the composite material manufacturing method according to the present disclosure can manufacture a composite material excellent in thermal conduction:

(A) Since the atmosphere for the infiltration is a vacuum atmosphere, a reducing atmosphere or an inert atmosphere, it is possible to inhibit the oxidation of Cu contained in the copper material or the copper material in a molten state (the molten copper) and the oxidation of the specific element contained in the second powder. In addition, the vacuum atmosphere and the reducing atmosphere can reduce Cu and the specific element. Therefore, the oxidation of Cu and the oxidation of the specific element are further inhibited. As a result, it is possible to inhibit the decrease in thermal conductivity due to the presence of an oxide of Cu or an oxide of the specific element.

(B) Both the first layer and the second layer contain the second powder. Since the second powder is relatively large in amount, the carbide layer may be easily formed. In addition, the carbide layer may be easily formed to have an appropriate thickness (see (2) in the above). From the viewpoint of inhibiting the oxidation of the specific element as described above, the carbide layer may be easily formed to have an appropriate thickness. Since the first powder made of the carbon-based substance and the molten copper are satisfactorily infiltrated through the carbide layer, the composite material may be made dense. A dense composite material is excellent in thermal conduction.

In addition, according to the composite material manufacturing method of the present disclosure, since the carbide layer may be appropriately formed, it is possible to manufacture the composite material excellent in thermal cycle characteristics. Since the carbon-based particles are easily wetted with the molten copper through the carbide layer, the carbon-based particles and the copper phase may be closely adhered to each other through the carbide layer. This close adhesion contributes to the improvement of the thermal cycle characteristics.

(Productivity)

The material used for infiltration may be manufactured by a simple process of stacking a layer containing the first powder and the second powder and a layer containing the copper material and the second powder. Further, as described above, since the carbide layer may be appropriately formed by inhibiting the oxidation of the specific element or the like, the molten copper may be satisfactorily infiltrated into the carbon-based particles. Further, since the infiltration is carried out without pressurization, compared with the case where the sintering is performed under a pressure of MPa level or GPa level, a dedicated equipment or the like configured to apply a high pressure is not required.

(11) As an example of the composite material manufacturing method of the present disclosure, according to an aspect, in the step of forming the laminated body, the amount of the second powder added to the first powder is set to such a range that the mass ratio of the element relative to the total amount of C and the element is 0.1% by mass or more and 15% by mass or less, and the amount of the second powder added to the copper material is set to such a range that the mass ratio of the element relative to the total amount of Cu and the element is 0.1% by mass or more and 1% by mass or less.

According to the aspect mentioned above, since the addition amount of the second powder is in the specific range mentioned above, the carbide layer may be formed to have an appropriate thickness (see also (2) in the above). Therefore, according to the aspect mentioned above, the materials are made dense due to the favorable infiltration as described above, and thereby, a composite material excellent in thermal conduction may be manufactured. Further, in the aspect mentioned above, since the carbon-based particles and the copper phase are closely adhered to each other through the carbide layer due to the favorable infiltration as described above, it is possible to manufacture a composite material excellent in thermal cycle characteristics.

(12) As an example of the composite material manufacturing method of the present disclosure, according to an aspect, the copper material includes a small piece made of oxygen-free copper having an oxygen concentration of 10 ppm or less by mass.

The small piece has a low oxygen concentration and a small specific surface area. Such a copper material is likely to inhibit the oxidation of Cu at high temperature, and thus to inhibit the oxidation of the specific element. By inhibiting the oxidation of the specific element, the carbide layer is appropriately formed as described above. Therefore, the densification is achieved by favorable infiltration and the adhesion between the carbon-based particles and the copper phase is achieved via the carbide layer. In addition, the decrease in thermal conductivity due to the presence of oxide is also inhibited. Further, the oxygen-free copper itself has a high thermal conductivity. Therefore, according to the aspect mentioned above, it is possible to manufacture the composite material excellent in thermal characteristics.

Details of Embodiment

Hereinafter, a composite material and a composite material manufacturing method according to an embodiment of the present disclosure will be described with reference to the drawings as appropriate.

Figure 1B:
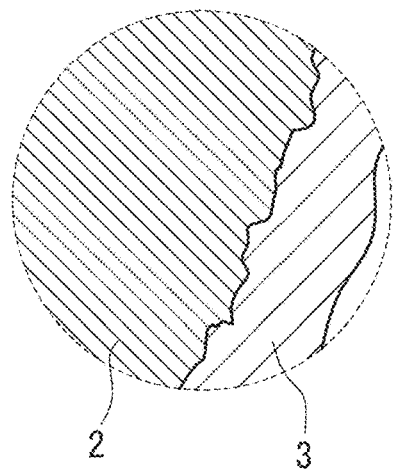
FIG. 1B is an enlarged view illustrating a part of the cross section inside a circle B illustrated in FIG. 1A.
Figure 1C:
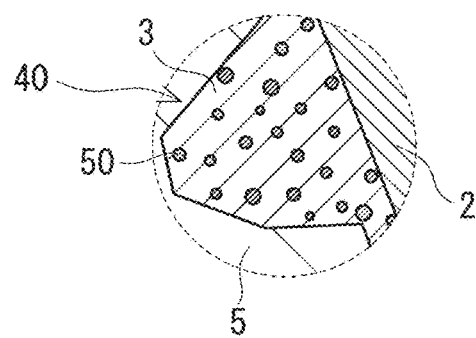
FIG. 1C is an enlarged view illustrating a part of the cross section inside a circle C illustrated in FIG. 1A.

FIG. 1 illustrates a carbide layer 3 in bold line so that the carbide layer 3 is more visible.

Figure 2A:
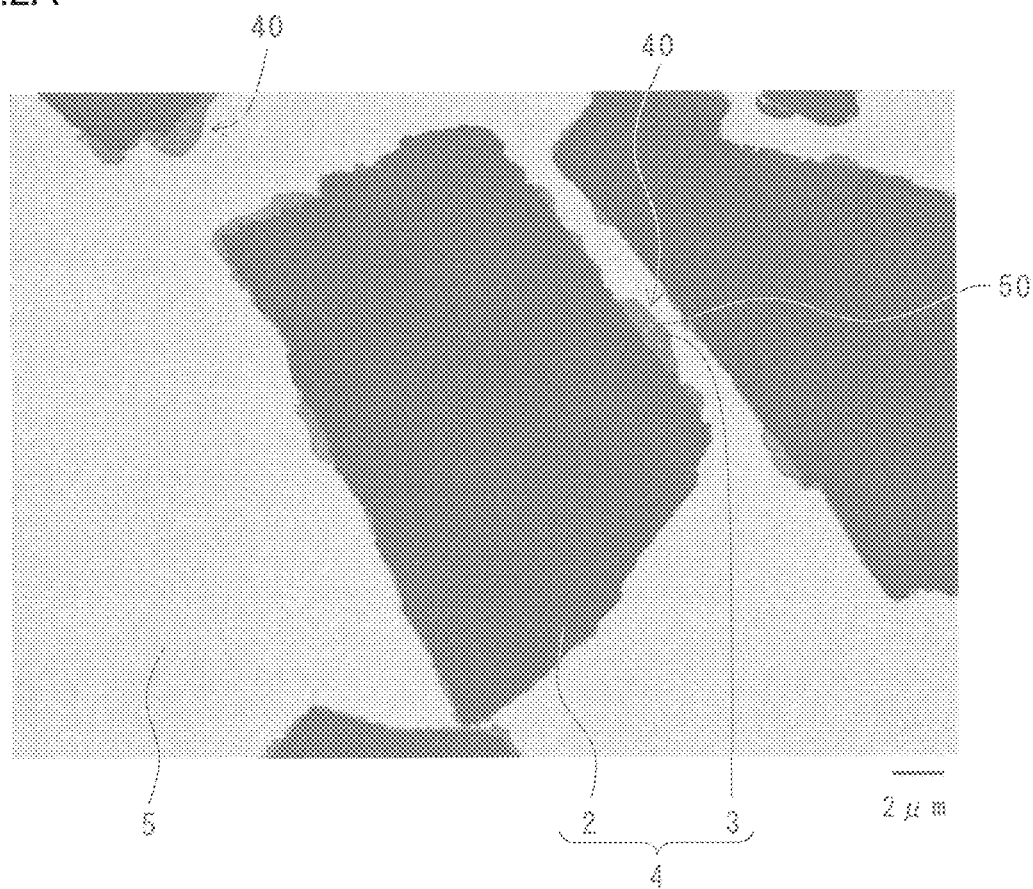
FIG. 2A is a micrograph illustrating a cross section of sample No. 45 prepared in Example 1.
Figure 2B:
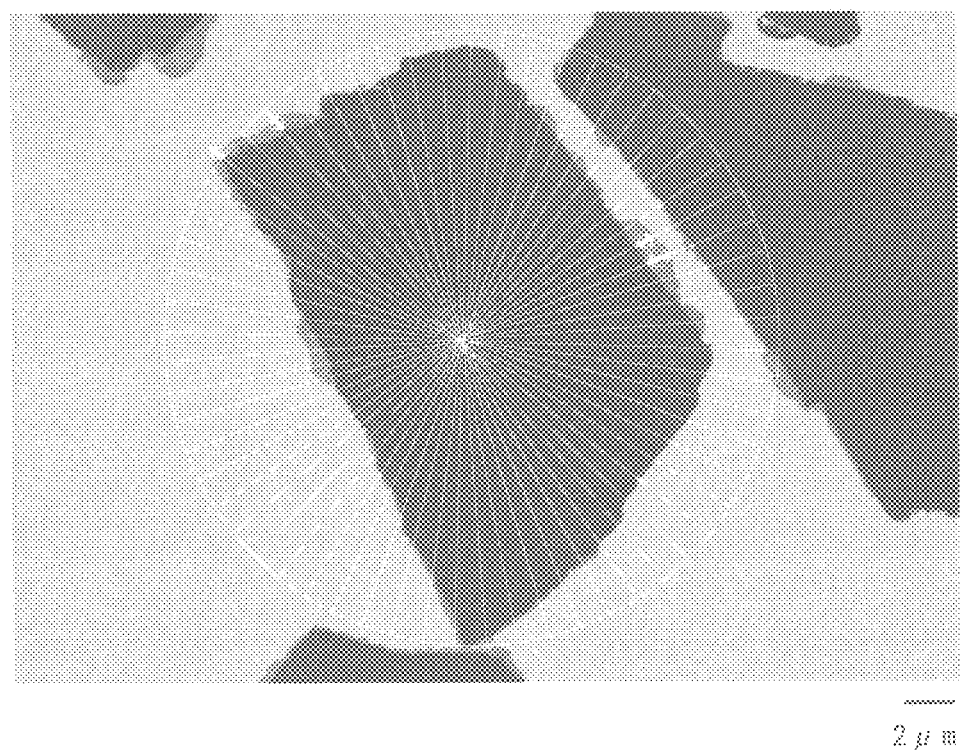
FIG. 2B is a view illustrating a method for measuring the thickness of a carbide layer using the micrograph illustrated in FIG. 2A.
Figure 3:
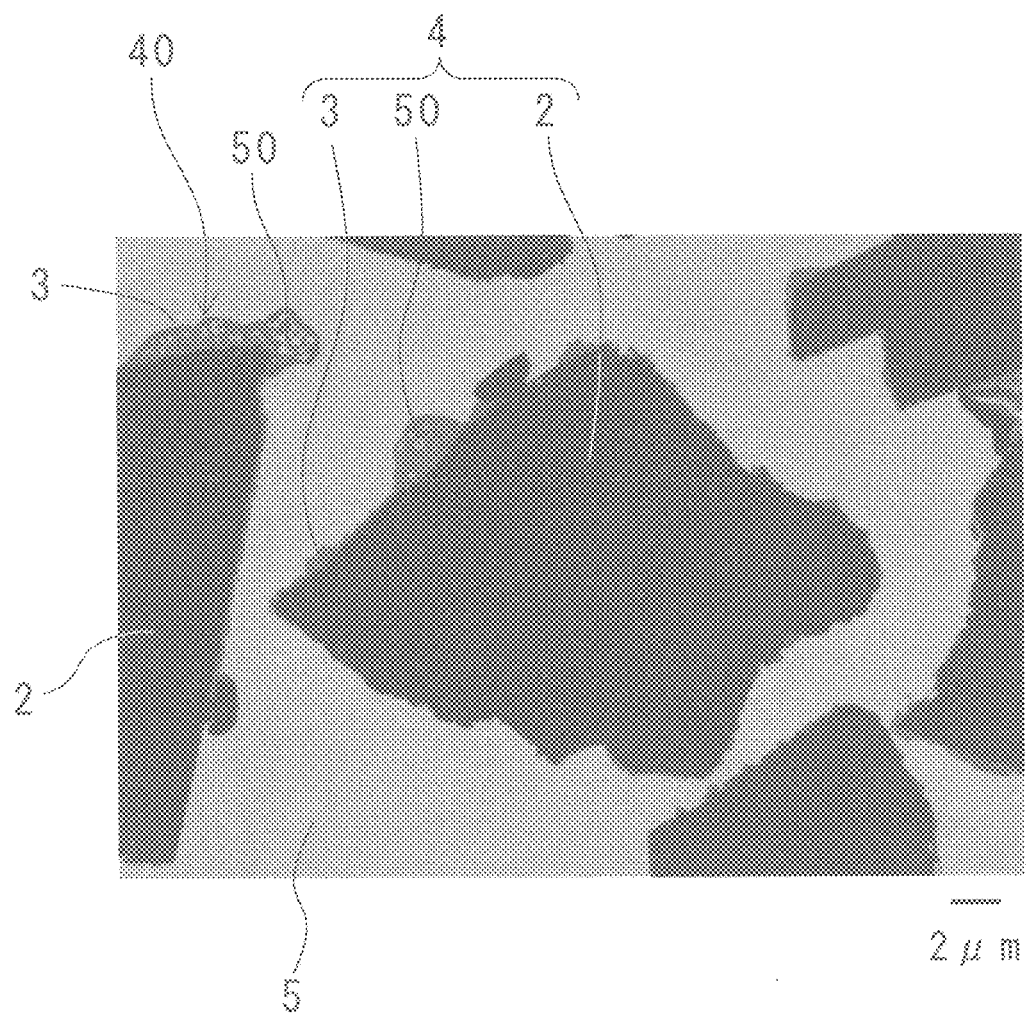
FIG. 3 is another micrograph illustrating the cross section of sample No. 45 prepared in Example 1.

FIGS. 2 and 3 are micrographs obtained with a scanning electron microscope (SEM) to observe a cross section of a composite material (sample No. 45) manufactured in Example 1 to be described later.

[Composite Material]

A composite material 1 of the embodiment is composed of a non-metal and a metal. The composite material 1 mainly contains coated particles 4 as the non-metal and a copper phase 5 as the metal. Specifically, as illustrated in FIG. 1A, the composite material 1 of the embodiment includes the coated particles 4 and the copper phase 5 that binds the coated particles 4 to each other. Each of the coated particles 4 include a carbon-based particle 2 made of a carbon-based substance and a carbide layer 3 that covers at least a part of the surface of the carbon-based particle 2. The carbide layer 3 is made of a carbide containing at least one element (specific element) selected from the group consisting of Si, Ti, Zr and Hf. Typically, a plurality of the coated particles 4 are present in the copper phase 5 in a dispersed state (see also the micrographs of FIGS. 2 and 3). Therefore, in the composite material 1, a gap is present between the adjacent coated particles 4 and 4. The coated particles 4 are bound together by the copper phase 5 present in the gap. The composite material 1 is molded into, for example, a rectangular flat plate in a plan view, and is used as a heat dissipation member of a semiconductor device.

Particularly, in the composite material 1 of the embodiment, the average particle size of the carbon-based particles 2 is 1 μm or more and 100 μm or less. The details will be described below. The method for measuring each parameter such as the average particle size will be collectively described later.

Note that in FIGS. 2 and 3, the black particles indicate the carbon-based particles 2, the dark gray film-like material covering the carbon-based particles 2 indicates the carbide layer 3, the light gray granular material in the carbide layer 3 indicates a copper component 50 (to be described later), and the light gray area covering the periphery of the carbon-based particles 2 indicates the copper phase 5.

(Coated Particles)
<Carbon-Based Particles>

The composite material 1 of the embodiment contains a plurality of carbon-based particles 2 as one of the main constituent elements.

1. Composition

The carbon-based substance constituting the carbon-based particles 2 includes at least one material selected from diamond, graphite, carbon nanotubes, and carbon fibers. Diamond has substantially no anisotropy in heat conduction, and typically has a high heat conductivity of 1000 W/mK or more. Moreover, since diamond powder is commercially available in various particle sizes, it is easy to obtain the raw material powder. From these points, the composite material 1 containing diamond may be appropriately used as a material for a heat dissipation member or the like, and is excellent in manufacturability.

Graphite is excellent in processing such as cutting. Therefore, the composite material 1 containing graphite is excellent in workability. The thermal conductivity of a carbon nanotube in the axial direction may be higher than the thermal conductivity of diamond in the axial direction. Therefore, it is expected that the composite material 1 containing carbon nanotubes is excellent in thermal conduction. Carbon fiber is excellent in mechanical strength. Therefore, the composite material 1 containing carbon fibers is excellent in mechanical strength.

The composite material 1 containing two or more carbon-based substances listed above may exhibit the effects described above in combination. For example, if the composite material 1 mainly contains diamond and partially contains graphite as the carbon-based substance, the composite material 1 may be excellent in thermal conduction and easy to be processed such as cutting.

2. Size

The average particle size of the carbon-based particles 2 in the composite material 1 is 1 μm or more and 100 μm or less. When the average particle size is 1 μm or more, it is possible to reduce the grain boundaries between the carbon-based particles 2 in the composite material 1, which makes the composite material 1 excellent in thermal conduction. For example, the composite material 1 may have a thermal conductivity of 200 W/mK or more.

Specifically, when the average particle size is 100 μm or less, the thermal conductivity is less likely to decrease even when subjected to a thermal cycle, and thereby, the thermal conductivity is maintained high even after the thermal cycle. In other words, it is possible to obtain the composite material 1 which has a small change in thermal conductivity before and after the thermal cycle and is excellent in thermal cycle characteristics. For example, compared with the case where the size of the particles is as coarse as 300 μm or more, when the average particle size is 100 μm or less, even if a stress is generated by the thermal cycle, the stress may be prevented from being concentrated on an interface between the carbon-based particles 2 and the copper phase 5. Further, at least a part of the surface of each carbon-based particle 2 in the composite material 1 is covered by the carbide layer 3. Typically, the carbon-based particles 2 adjacent to each other are not integrally bound by the carbide that forms the carbide layer 3. Each carbon-based particle 2 is present in the copper phase 5 independently. Therefore, the position of each carbon-based particle 2 in the copper phase 5 is variable in some degree. This may contribute to the fact of preventing the stress from being concentrated on the interface. If the stress is prevented from being concentrated on the interface, the interfacial peeling between the carbon-based particles 2 (coated particles 4) and the copper phase 5 due to the thermal expansion and contraction in the thermal cycle is reduced. As a result, it is possible for the composite material 1 to maintain the thermal conductivity after the thermal cycle as high as it is before the thermal cycle.

Further, if the average particle size is 100 μm or less, it is easy to perform the processing such as cutting in the manufacturing process, which makes the composite material 1 excellent in workability. Therefore, it is easy to form the plate material or the like made of the composite material 1 into a predetermined shape and a predetermined size by grinding or polishing the composite material 1 in the manufacturing process. Even if the coated particles 4 are detached by polishing or the like, the irregularity of the surface after polishing is small. Therefore, it is possible to plate a metal layer on the polished surface with an uniform thickness, and it is possible to join an insulating substrate to the polished surface by soldering or the like. Furthermore, if the average particle size is 100 μm or less, the composite material 1 may be easily formed into a thin plate or the like. The thin composite material 1 may be suitably used as a material for a thin heat dissipation member.

If it is desired to improve the thermal conduction, the average particle size may be preferably 5 μm or more, and more preferably 10 μm or more, 15 μm or more, or 20 or more. If it is desired to improve the thermal cycle characteristics, improve the workability, or reduce the thickness, the average particle size may be preferably 90 μm or less, and more preferably 80 μm or less, 70 μm or less, or 60 μm or less.

The composite material 1 may include relatively fine particles and relatively coarse particles as long as the average particle size thereof is in the range of 1 μm or more and 100 μm or less. If the composite material 1 includes fine particles and coarse particles, the composite material 1 may be made dense, and thereby has a relatively high density.

3. Content

The content of the carbon-based particles 2 in the composite material 1 may be 40% by volume or more and 85% by volume or less. If the content is 40% by volume or more, the composite material 1 contains a larger amount of the carbon-based particles 2 excellent in thermal conduction, and thereby, the composite material 1 is excellent in thermal conduction and has a linear expansion coefficient smaller than that of Cu. If the content is 85% by volume or less, not too many of the carbon-based particles 2 and an appropriate amount of the copper phase 5 are contained in the composite material 1, it is possible to prevent the linear expansion coefficient of the composite material 1 from becoming too small. For example, the composite material 1 may have a thermal conductivity of 200 W/mK or more and a linear expansion coefficient of $4 \times 10^{-6}$/K or more and $15 \times 10^{-6}$/K or less. Since the composite material 1 has a high thermal conductivity and a linear expansion coefficient close to that of a semiconductor device (such as GaN (gallium nitride): about $5.5 \times 10^{-6}$/K) and its peripheral components (such as the insulating substrate or package parts), it may be suitably used as a heat dissipation member for the semiconductor device. Further, if the content is 85% by volume or less, it is easy for the molten copper to infiltrate into the carbon-based particles 2 in the manufacturing process. Therefore, it is possible to inhibit the occurrence of non-infiltrated portions. Further, the composite material 1 may be made dense and is easy to be compounded. Therefore, the composite material 1 is excellent in manufacturability.

If it is desired to improve the thermal conduction, the content may be preferably 45% by volume or more, and more preferably 50% by volume or more, 55% by volume or more, or 60% by volume or more. If it is desired to improve the manufacturability or the like, the content may be preferably 80% by volume or less, and more preferably 75% by volume or less. The rest of the composite material 1 is mainly the copper phase 5 (more than 15% by volume and less than 60% by volume) and a small amount of the carbide layer 3 (for example, 4% by volume or less).

4. Shape

The shape of the carbon-based particles 2 is not particularly limited. The carbon-based particles 2 schematically illustrated in FIG. 1 have a polygonal shape, but as illustrated in FIGS. 2 and 3, the carbon-based particles 2 may have an irregular cross-sectional shape.

The surface of the carbon-based particles 2 may be rough to some extent, and may have irregularities (FIGS. 1B, 2 and 3). For example, quantitatively, in the cross section of the composite material 1, the degree of irregularity is 1.2 or more. The degree of irregularity ($L_2/L_0$) is obtained by dividing the contour length $L_2$ of the carbon-based particle 2 by the circumferential length $L_0$ of an equivalent circle of the carbon-based particle 2. FIG. 1B illustrates the irregularities in bold line so that the degree of irregularity is more visible.

If the degree of irregularity is 1.2 or more, it may be said that the surface of the carbon-based particles 2 is rough to some extent. Such carbon-based particles 2 may have a large contact area with the carbide layer 3, and thereby may be firmly bonded to the carbide layer 3. As a result, the carbon-based particles 2 may be firmly bonded to the copper phase 5 via the carbide layer 3. Thus, the composite material 1 is excellent in the interfacial strength between the carbon-based particles 2, the carbide layer 3 and the copper phase 5. Therefore, the interface is unlikely to be changed even when subjected to a thermal cycle. Therefore, it is expected that the composite material 1 is excellent in thermal cycling characteristics. Further, since the three members are firmly bonded together, the composite material 1 is excellent in mechanical strength. Furthermore, the copper phase 5 can firmly hold the carbon-based particles 2. Therefore, when cutting or the like is performed in the manufacturing process, the carbon particles 2 (the coated particles 4) are unlikely to be peeled off from the surface. Thereby, the composite material 1 is also excellent in manufacturability.

If it is desired to improve the interfacial strength, the workability or the like, the degree of irregularity is preferably 1.3 or more, and more preferably 1.4 or more, or 1.5 or more. The upper limit of the degree of irregularity is not particularly provided, it may be about 3 or less. The composite material 1 having a degree of irregularity of 1.2 or more may be manufactured by, for example, a composite material manufacturing method according to an embodiment to be described later.

<Carbide Layer>

1. Composition

Typically, each carbon-based particle 2 is present in the composite material 1 as a coated particle 4. At least a part of the surface, and in particular substantially all of the surface of the carbon-based particle 2 constituting the coated particle 4 is covered with the carbide layer 3. The carbide constituting the carbide layer 3 contains at least one element (specific element) selected from the group consisting of Si, Ti, Zr and Hf. As examples of carbides containing one kind of the specific element, SiC (silicon carbide), TiC (titanium carbide), ZrC (zirconium carbide), and HfC (hafnium carbide) may be given. The carbide constituting the carbide layer 3 may include plural kinds of the specific elements. Carbon (C) contained the carbides mentioned above is typically derived from the carbon-based particles 2. The carbide layer 3 is closely adhered to the carbon-based particles 2. Further, the carbide layer 3 is easily wetted with the molten copper during the manufacturing process, and is closely adhered to the copper phase 5. Since the carbide layer 3 is closely adhered to both the carbon-based particles 2 and the copper phase 5, the composite material 1 may be made dense with few pores. Therefore, the decrease in thermal conductivity of the composite material 1 due to pores is smaller, which makes the composite material 1 excellent in thermal conduction. Further, due to the close adhesion between the carbon-based particles 2 and the copper phase 5 interposed by the carbide layer 3, the composite material 1 is excellent in thermal cycle characteristics as compared with a composite material without the carbide layer 3. The close adhesion makes it difficult for the interface between 3 members of the carbon-based particles 2, the carbide layer 3 and the copper phase 5 to be changed even when subjected to a thermal cycle.

The composite material 1 may include the coated particles 4, at least a part of which encapsulates the copper component 50 in a part of the carbide layer 3 (hereinafter referred to as copper-encapsulated particles, see for example FIGS. 2 and 3). As to be described below, it is preferable that the composite material 1 contains the copper-encapsulated particles, which makes it excellent in thermal conduction. The thermal conductivity of the carbide constituting the carbide layer 3 is lower than the thermal conductivity of the carbon-based substance such as diamond constituting the carbon-based particles 2 or the thermal conductivity of Cu constituting the copper phase 5. Compared with a composite material including a pure carbide layer 3 between the carbon-based particles 2 and the copper phase 5, if the carbide layer 3 contains the copper component 50 mainly composed of Cu having a high thermal conductivity, the heat transfer between the carbon-based particles 2 and the copper phase 5 would be improved. Therefore, a large decrease in the thermal conductivity due to the presence of the carbide layer 3 is inhibited. In addition, the inclusion of relatively soft Cu in the relatively brittle carbide makes it possible to increase the strength and toughness of the carbide layer 3. As a result, it is expected to improve the interfacial strength of the composite material 1.

The more the copper-encapsulated particles in the coated particles 4 of the composite material 1 is, the better the thermal conduction is, which is preferable. For example, quantitatively, in the cross section of the composite material 1, the ratio of the total cross sectional area of the copper-encapsulated particles relative to the total cross sectional area of the coated particles 4 is 30% or more. If the total cross sectional area of the coated particles 4 present in the cross section of the composite material 1 is defined as 100%, it may be said that there are many copper-encapsulated particles if the area ratio of the copper-encapsulated particles is 30% or more. Such composite material 1 is excellent in thermal conduction because the decrease in thermal conductivity thereof is small. The larger the area ratio is, the smaller the decrease in thermal conductivity is. From the viewpoint of thermal conduction, the area ratio is preferably 35% or more, 40% or more, and 50% or more. Further, the area ratio is preferably 60% or more, more preferably 70% or more, and further preferably 80% or more. It is even more preferable that substantially all of the coated particles 4 are the copper-encapsulated particles.

Regarding the copper-encapsulated particles, the higher the content of the copper component 50 in each of the copper-encapsulated particles is, the better the thermal conduction is. If the content of the copper component 50 is not too high, the carbide containing the specific element is appropriately present, which makes it possible to improve the wettability in the manufacturing process. Quantitatively, for example, the total content of the copper component 50 in the carbide layer 3 of the copper-encapsulated particles is 1% by volume or more and 70% by volume or less.

Compared with the copper-encapsulated particles having a smaller content of the copper component 50, if the total content of the copper component 50 in the carbide layer 3 is 1% by volume or more, the presence of the copper component 50 may improve the heat transfer appropriately. The higher the total content is, the greater the improvement will be. From the viewpoint of improving the thermal conduction, the total content is preferably 5% by volume or more, 10% by volume or more, 15% by volume or more, and 20% by volume or more. Furthermore, the total content is more preferably 30% by volume or more, and 40% by volume or more.

If the total content of the copper component 50 in the carbide layer 3 is 70% by volume or less, the decrease in wettability due to the presence of the copper component 50 is inhibited, and the molten copper is satisfactorily infiltrated in the manufacturing process, which is excellent in manufacturability. Further, it is possible to prevent a copper encapsulated portion 40 that encapsulates the copper component 50 in the carbide layer 3 from becoming thicker. In the present disclosure, as illustrated in FIGS. 1 to 3, the thickness of the copper encapsulated portion 40 that encapsulates the copper component 50 in the carbide layer 3 tends to become locally thicker. In particular, as illustrated in FIG. 3, as the amount of the copper component 50 increases, the thickness of the copper encapsulated portion 40 tends to become locally thicker. If the total content is 70% by volume or less, it is possible to prevent the carbide layer from becoming locally thicker, which makes it possible to reduce the maximum thickness of the carbide layer 3 (such as 3 μm or less, which will be described below). From the viewpoint of preventing the carbide layer from becoming locally thicker, it is preferable that the carbide layer 3 contains a small amount of Cu particles and has a thickness on the order of several tens of nanometers to several hundreds of nanometers. From the viewpoint of improving the wettability and preventing the carbide layer from becoming locally thicker, the total content is preferably 65% by volume or less, and more preferably 60% by volume or less, or 55% by volume or less.

In the carbide layer 3 of a single copper-encapsulated particle, the copper encapsulated portion 40 that encapsulates the copper component 50 is locally thick, and there may be a plurality of thick portions spaced apart in the circumferential direction of the carbide layer 3 (see FIGS. 2 and 3). In this case, for each of the copper encapsulated portions 40 having a thickness of 1 μm or more, it is preferable that the total area of the carbide containing the specific element and the copper component 50 is 30 μm$^2$ or less, which makes it possible to reduce the maximum thickness of the carbide layer 3 (such as 3 μm or less, which will be described below). Further, if the length of the carbon-based particles 2 in the circumferential direction at the portion having a thickness of 1 μm or more is relatively short, the thick portion in the carbide layer 3 is small. Such composite material 1 is excellent in thermal conduction.

It is preferable that the area ratio of the copper-encapsulated particles is 30% or more and that the total content of the copper component 50 in the carbide layer 3 is 1% by volume or more and 70% by volume or less. In this case, the carbide containing the specific element and the copper component 50 may be well balanced. Therefore, the composite material 1 may have a good balance between the effect of improving the thermal conduction due to the presence of the copper component 50 and the effect of improving the wettability due to the carbide layer 3 made of the carbide. The composite material 1 containing the copper-encapsulated particles may be manufactured by, for example, a composite material manufacturing method according to an embodiment to be described later.

2. Thickness

As described above, it is preferable that the thickness of the carbide layer 3 is small within a range so as to improve the wettability. Quantitatively, for example, the maximum thickness of the carbide layer 3 is 3 μm or less. If the maximum thickness is 3 μm or less, it may be said that the carbide layer 3 is thin as a whole even if the carbide layer 3 has a locally thick portion. Therefore, the decrease in thermal conductivity due to the carbide layer 3 is inhibited, which makes the composite material 1 excellent in thermal conduction. The smaller the maximum thickness is, the smaller the decrease in thermal conductivity due to the carbide layer 3 is. The maximum thickness is preferably 1.8 μm or less, 1.5 μm or less, and 1.0 μm or less. As an example of the portion having the maximum thickness in the carbide layer 3, the copper encapsulated portion 40 that encapsulates the copper component 50 described above may be given.

In addition to the maximum thickness, it is more preferable to make the average thickness of the carbide layer 3 thin. The average thickness is preferably less than 0.50 μm, 0.40 μm or less, 0.30 μm or less, and 0.20 μm or less, and more preferably 0.15 μm or less. However, if the average thickness is too thin, it is difficult for the carbide layer 3 to properly improve the wettability. Therefore, the average thickness is 0.01 μm or more, 0.03 μm or more, and 0.05 μm or more. Even if the carbide layer 3 has locally thick portions, it is thin as a whole, and thereby, the composite material 1 may have a high thermal conductivity even if the carbon-based particles 2 have an average particle size of 100 μm or less.

In order to adjust the thickness of the carbide layer 3, for example, the addition amount of powder (a second powder to be described below) added to the carbide layer 3 as a raw material, the infiltration condition and the like may be adjusted. In general, the smaller the addition amount or the lower the infiltration temperature is, the smaller the thickness of the carbide layer 3 tends to be.

3. Others

It is preferable that each of the carbon-based particles 2 in the composite material 1 is a coated particle 4 covered by the carbide layer 3. In each coated particle 4, it is preferable that 90% or more of the surface, more preferably 95% or more of the surface, and particularly preferably the entire surface of the carbon-based particle 2 is substantially covered by the carbide layer 3, which makes the composite material 1 denser. The ratio of the partial surface covered by the carbide layer 3 relative to the entire surface of the carbon-based particle 2 may be simply regarded as the ratio of the inner peripheral length of the carbide layer 3 relative to the peripheral length of the carbon-based particle 2 in the cross section of the composite material 1. Further, the composite material 1 may include a connecting portion in which the adjacent coated particles 4 are partially bonded by the carbide layer 3 (carbide). However, it is preferable that the composite material 1 substantially does not include any connecting portion and the coated particles 4 are all randomly dispersed in the copper phase 5, which makes the composite material 1 excellent in thermal cycle characteristics. The composite material 1 in which the coated particles 4 are all randomly dispersed in the copper phase 5 is excellent in toughness as compared with a composite material which includes many connecting portions, which makes it suitable to warping processing or the like.

<Metal Phase>

The composite material 1 contains the copper phase 5 as one of the main constituent elements.

The copper phase 5 is mainly composed of the so-called pure copper. In the present disclosure, the pure copper typically contains Cu at 99.0% by mass or more, and inevitable impurities as the balance. As described above, the composite material 1 is mainly composed of the carbon-based particles 2 having a high thermal conductivity and Cu having a high thermal conductivity of about 400 W/mK, and thereby is excellent in thermal conduction.

It is preferable that the content of the specific element in the copper phase 5 is 1% by mass or less. In the present disclosure, depending on the manufacturing conditions or the like, the copper phase 5 may contain the specific element. However, if the content of the specific element is 1% by mass or less, it may be said that the copper phase 5 contains few specific element having a thermal conductivity lower than Cu. Since the decrease in thermal conductivity due to the presence of the specific element in the copper phase 5 is inhibited, the composite material 1 is excellent in thermal conduction. The smaller the content of the specific element is, the greater the effect will be. The content of the specific element is preferably 0.9% by mass or less, 0.8% by mass or less, or 0.7% by mass or less, and more preferably 0.5% by mass or less. In order to reduce the content of the specific element, for example, it is possible to reduce the addition amount of the powder used as the raw material of the carbide layer 3 or to lower the infiltration temperature.

<Measuring Method>

The average particle size of the carbon-based particles 2 in the composite material 1 may be measured by using a cross-section observation image of the composite material 1. In the cross-section observation image, a circle (equivalent circle) corresponding in area to each carbon-based particle 2 is obtained. The diameter of the equivalent circle is defined as the particle size of the carbon-based particle 2. The average value of 10 or more particle sizes is defined as the average particle size of the carbon-based particles 2.

The content of the carbon-based particles 2 in the composite material 1 may be measured by using a cross-section observation image of the composite material 1. In the cross-section observation image, the total cross-sectional area of the carbon-based particles 2 is obtained. The ratio of the total cross-sectional area of the carbon-based particles 2 relative to the cross-sectional area of the composite material 1 is regarded as the volume ratio.

The degree of irregularity may be measured by using a cross-section observation image of the composite material 1. In the cross-sectional observation image, the contour length $L_2$ of each carbon-based particle 2 and the circumferential length $L_0$ of the equivalent circle are obtained, and the degree of irregularity is calculated as ($L_2/L_0$). The degree of irregularity is calculated for 10 or more of the coated particles 4, and averaged. The average value is defined as the degree of irregularity of the carbon-based particles 2.

The maximum thickness of the carbide layer 3 may be measured by using a cross-section observation image of the composite material 1. Specifically, the measurement is performed as follows. As illustrated in FIG. 2A, a coated particle 4 is extracted from the cross-section observation image. As illustrated in FIG. 2B, a circumscribed circle of the carbon-based particle 2 is drawn for the coated particle 4. In the circumscribed circle, 60 diameters are drawn at equal angles (6°). FIG. 2B illustrates the circumscribed circle and the diameters in white line. A line segment that crosses the carbide layer 3 as a straight line or an extension line along each diameter is determined, and the length (white arrow in FIG. 2B) of each line segment is measured. Of the measured 60 line segments, the lengths of the top 5 longer line segments are averaged. The average value is defined as the maximum thickness of the carbide layer 3 in the coated particle 4. The measurement is performed for 10 or more of the coated particles 4. The maximum thicknesses for 10 or more of the carbide layers 3 are averaged. The average thickness is defined as the maximum thickness of the carbide layer 3.

The average thickness of the carbide layer 3 is measured as follows. The lengths of the 60 line segments are averaged. The average value is defined as the average thickness of the carbide layer 3 in one coated particle 4. The average thicknesses are obtained for 10 or more carbide layers 3, and are averaged. The average value is defined as the average thickness of the carbide layer 3.

The area ratio of the copper-encapsulated particles may be measured by using a cross-sectional observation image of the composite material 1. First, a cross section of the composite material 1 is taken. From this cross section, a cross-section observation image is taken for a measurement region having a predetermined size (such as 80 µm×120 µm). All of the coated particles and the copper-encapsulated particles are extracted from the measurement region. The total area of the extracted coated particles and the total area of the extracted copper-encapsulated particles are determined. The area ratio is calculated according to the following expression: [(the total area of the extracted copper-encapsulated particles)/(the total area of the extracted coated particles)]×100, and is defined as the area ratio of the copper-encapsulated particles. A plurality (such as 3 or more) of the measurement regions may be taken from one cross section or a plurality of cross sections, and a plurality of area ratios may be averaged (the same applies to the calculation of the total content of the copper component 50 to be described later). As illustrated in the SEM images of FIGS. 2 and 3, the encapsulation of the copper component 50 in the carbide layer 3 may be confirmed by the color difference.

In the copper-encapsulated particles, the total content of the copper component 50 in the carbide layer 3 is measured by using a cross-sectional observation image of the composite material 1 to determine the area ratio and considering the area ratio as the volume ratio. Specifically, the total content is measured as follows. The total area of the copper component 50 and the area of the carbide layer 3 (the total area of the carbide containing the specific element and the copper component 50) are measured for all the copper-encapsulated particles extracted from the measurement region. The area ratio of the copper component 50 in each copper-encapsulated particle is determined according to the following expression: [(the total area of the copper component 50)/(the area of the carbide layer 3)]×100. The area ratios of the copper component 50 for all of the extracted copper-encapsulated particles are averaged. The average value is defined as the area ratio of the copper component 50 and is regarded as the volume ratio.

The area ratio of the copper-encapsulated particles including the carbide layer that contains the copper component 50 at the volume ratio of 1% by volume or more and 70% by volume or less is determined as follows. From the copper-encapsulated particles, those copper-encapsulated particles in which the volume ratio of the copper component 50 satisfies the above range are extracted. The total area of the extracted copper-encapsulated particles is calculated. Then, the area ratio of the copper-encapsulated particles may be calculated according to the following expression: [(the total area of the extracted copper-encapsulated particles)/(the total area of the extracted coated particles)]×100.

The content of the specific element in the copper phase 5 may be measured by taking a cross section of the composite material 1 and performing a local component analysis on the cross section using EDX (energy dispersive X-ray spectroscopy) or the like. SEM-EDX may be used in the local component analysis, and in particular a silicon drift detector (SDD) may be used in the local component analysis as an EDX device.

Thus, a commercially available image processing device may be used to readily perform the extraction of a measurement target and the measurement of each of the parameters mentioned above from the cross-sectional observation image.

Note that the average particle size and the content of the carbon-based particles 2 in the composite material 1 depend on the particle size and the addition amount of the powder (the first powder described below) which is made of the carbon-based substance and used as the raw material. Although a part of the particles in the raw material powder is used to form the carbide layer 3, the particle size and the content of the carbon-based particles 2 in the composite material 1 are substantially equal to the particle size and the addition amount of the raw material powder, respectively.

(Characteristics)
<Thermal Characteristics>

As described above, the composite material 1 of the embodiment is excellent in thermal conduction, and has a thermal conductivity of 170 W/mK or more, for example. Furthermore, the composite material 1 may have a thermal conductivity of 200 W/mK or more. Since the higher the thermal conductivity is, the more excellent the thermal conduction is, the composite material 1 may be suitably used as a heat dissipation member of a semiconductor device. Therefore, the thermal conductivity of the composite material 1 is preferably 220 W/mK or more, 240 W/mK or more, and 250 W/mK or more, and more preferably 300 W/mK or more, 350 W/mK or more, and 400 W/mK or more. Typically, the thermal conductivity tends to become greater as the average particle size of the carbon-based particles 2 become larger or the content of the carbon-based particles 2 becomes greater. When the composite material 1 is used as the material of the heat dissipation member, the thermal conductivity has no upper limit since a higher thermal conductivity is more preferred. When the thermal conductivity is about 800 W/mK or less, the powder made of the carbon-based substance is not too much in the manufacturing process and is easily infiltrated, which makes it possible to manufacture the composite material 1 easily.

As described above, the composite material 1 of the embodiment has a linear expansion coefficient between that of the carbon-based substance and that of Cu. Quantitatively, the linear expansion coefficient of the composite material 1 may be $4 \times 10^{-6}$/K or more and $15 \times 10^{-6}$/K or less. The linear expansion coefficient typically tends to decrease as the content of the carbon-based particles 2 increases. Depending on the content of the carbon-based particles 2, the linear expansion coefficient may be $4.5 \times 10^{-6}$/K or more and $13 \times 10^{-6}$/K or less, or $4.5 \times 10^{-6}$/K or more and $10 \times 10^{-6}$/K or less.

As described above, the composite material 1 having a thermal conductivity of 200 W/mK or more and a linear expansion coefficient of $4 \times 10^{-6}$/K or more and $15 \times 10^{-6}$/K or less is excellent in thermal conduction, and has excellent compatibility with the linear expansion coefficient of the semiconductor device and its peripheral components. Therefore, the composite material 1 may be suitably used as a material for a heat dissipation member of a semiconductor device.

<Relative Density>

As described above, the composite material 1 of the embodiment contains a small amount of pores and is typically dense, and thereby has a high relative density. Quantitatively, for example, the relative density of the composite material 1 is 80% or more. The higher the relative density is, the denser the composite material 1 is, the thermal conductivity is unlikely to be decreased by the pores, which makes it excellent in thermal conduction. Therefore, the relative density is preferably 85% or more, more preferably 90% or more, 95% or more, 96% or more, 97% or more, and particularly preferably 98% or more. The relative density may be increased by adjusting the size and amount of the powder made of the carbon-based substance, the amount of the powder added to the carbide layer 3 as the raw material, the infiltration conditions or the like in the manufacturing process.

<Oxygen Concentration>

The composite material 1 of the embodiment is manufactured by the composite material manufacturing method of an embodiment to be described later, and typically has a low oxygen content. The composite material 1 is excellent in thermal conduction since the decrease in thermal conductivity due to the presence of the oxide is inhibited. If the content of oxygen in the composite material 1 is small, the oxidation of Cu and the specific element may be inhibited in the manufacturing process. Therefore, the carbide layer 3 may be formed appropriately, which improves manufacturability. If the carbide layer 3 is appropriately formed, the thermal cycle characteristics may be improved as described above. Quantitatively, for example, the content of oxygen in the composite material 1 is 0.05% by mass or less. As the content of oxygen is smaller, the amount of oxide is smaller, which makes it possible to inhibit the decrease in thermal conductivity due to the oxide. Therefore, the oxygen content is preferably 0.04% by mass or less, and more preferably 0.03% by mass or less. The oxygen content may be reduced, for example, by reducing the oxygen concentration in the atmosphere during infiltration or by using oxygen-free copper or a copper having a large specific surface area as the copper material in the manufacturing process.

(Usage)

As described above, the composite material 1 of the embodiment is excellent in thermal conduction, and thereby may be suitably used as a material for a heat dissipation member. In particular, the composite material 1 having excellent compatibility with the linear expansion coefficient of the semiconductor device and its peripheral components may be suitably used as a material for a heat dissipation member of the semiconductor device. The semiconductor device including a plate-shaped heat dissipation member made of the composite material 1 of the embodiment may be used in various electronic devices such as a high frequency power device (such as LDMOS (Laterally Diffused Metal Oxide Semiconductor)), a semiconductor laser device or a light emitting diode device, or in various computers such as a central processing unit (CPU), a graphic processing unit (GPU), a high electron mobile transistor (HEMT), a chipset, a memory chip or the like.

(Main Effects)

The composite material 1 of the embodiment has a high thermal conductivity and is excellent in thermal conduction. This effect will be described in detail in Example 1 to be described later. Further, when the composite material 1 of the embodiment is used as the material for a heat dissipation member, it is expected that the heat dissipation member has a small change in the thermal conductivity before and after the thermal cycle, and thereby has a high thermal conductivity even after the thermal cycle. Since the composite material 1 may be manufactured by, for example, a composite material manufacturing method of an embodiment to be described later, it is excellent in manufacturability. In addition, the composite material 1 is excellent in manufacturability because it is suitable to the processing such as cutting as described above.

[Composite Material Manufacturing Method]

<Outline>

The composite material manufacturing method according to an embodiment is used to manufacture a composite material such as the composite material 1 including the carbon-based particles 2, the carbide layer 3 and the copper phase 5, and includes the following steps:

(First Step) A laminated body is formed by laminating a first layer and a second layer.

The first layer contains a first powder made of a carbon-based substance, and a second powder made of at least one of a compound containing at least one element (specific element) selected from the group consisting of Si, Ti, Zr and Hf, and the element itself.

The second layer contains a copper material composed of Cu and inevitable impurities, and the second powder.

(Second Step) The laminated body is heated.

In the second step, the laminated body is heated under a vacuum atmosphere of 1 Pa or less, a reducing atmosphere or an inert atmosphere without pressurization, and the copper in the molten state is compounded with the first powder.

In the composite material manufacturing method according to the embodiment, a carbide layer made of a carbide containing a specific element is spontaneously formed on the surface of the carbon-based particles by a reaction between C on the surface of the carbon-based particles and the specific element in the second powder during infiltration, and meanwhile, the carbon-based particles and the copper material in the molten state (molten copper) are compounded. In particular, in the composite material manufacturing method according to the embodiment, the vacuum atmosphere, the reducing atmosphere, or the inert atmosphere is used as the infiltration atmosphere, and thereby the oxidation of Cu in the copper material and the specific element in the second powder is inhibited. In addition, the second powder is added to both the first powder and the copper material, and thus, the amount of the second powder is increased, which makes it possible to form the carbide layer to an appropriate thickness.

When the so-called pure copper is used as the metal phase, it is necessary to raise the infiltration temperature (the melting temperature of the metal) higher than that of the Cu—Ag alloy. Cu is more likely to be oxidized in a high temperature environment than Ag. Therefore, if the infiltration temperature is raised, Cu is likely to be oxidized by oxygen derived from the reaction atmosphere, the raw materials or the like at a high temperature before reaching the predetermined infiltration temperature, and thereby, the specific element may be oxidized by the oxygen contained in copper oxide during infiltration. To solve this problem, in the composite material manufacturing method according to the embodiment, a vacuum atmosphere, a reducing atmosphere, or an inert atmosphere is used as the infiltration atmosphere so as to inhibit the oxidation of Cu and the specific element. In particular, if a vacuum atmosphere or a reducing atmosphere is used, Cu and the specific element are reduced instead of being oxidized, which further inhibits the oxidation of Cu and the specific element.

As described above, in order to prevent the specific element from being oxidized, the amount of the second powder is increased. However, as described in PTL 1, if a large amount of the second powder is simply mixed with the first powder, the carbide layer tends to become too thick; and if the infiltration temperature is raised as described above, the carbide layer tends to become thicker. In the composite material manufacturing method according to the embodiment, the second powder is added to both the first powder and the copper material, and thus, the amount of the second powder is increased, which makes it possible to form the carbide layer to an appropriate thickness. One reason is that since only a part of the total amount of the second powder is mixed with the first powder, the amount of the specific element present around the carbon-based particles is decreased to some extent. As a result, it is possible to prevent the carbide layer from being formed in the solid sintering of C of the carbon-based particles and the specific element until the predetermined infiltration temperature is reached. Another reason is that since the oxidation of the specific element is inhibited as described above, C of the carbon-based particles and the specific element can react with each other satisfactorily.

Each step will be described hereinafter.

(First Step: A Step of Preparing Materials for Infiltration)

In this step, the first powder, the second powder, and the copper material are prepared as the raw materials to form the laminated body.

<Raw Materials>

The first powder is made of the carbon-based substance, and has a predetermined particle size. Commercially available diamond powder or the like may be used as the first powder. Regarding the particle size of the first powder, refer to the section described above about the average particle size of the carbon-based particles. The particle size of the first powder may be measured by using, for example, a commercially available particle image analyzer, a particle size distribution measuring device or the like.

The second powder may a powder made of a specific element itself, a compound powder made of a compound containing a specific element, or a powder made of both the specific element and the compound. In particular, the second powder preferably contains the compound powder, and the compound may have an oxygen decreasing or removing property such as a reducing property during infiltration. Since the specific element is present in the compound powder as a compound before infiltration, it is possible to inhibit the oxidation of the specific element. Further, the compound powder is reduced during infiltration, which makes it possible to lower or remove oxygen from the oxidized copper surface or the like. As examples of a compound containing the specific element, sulfide, nitride, hydride, boride and the like may be given. A plural kinds of compound powders may be used in combination.

The copper material is made of the so-called pure copper. In particular, it is preferable that the copper material contains Cu at 99.8% by mass or more and inevitable impurities as the balance. Further, the copper material preferably has a low oxygen concentration. Since the copper material itself has a high thermal conductivity, it may be used to manufacture a composite material excellent in thermal conduction. Further, since the oxygen concentration of the copper material is low, the oxidation of the specific element of the second powder is inhibited during infiltration, and thereby, it may be used to manufacture a composite material excellent in thermal conduction. Quantitatively, the oxygen concentration of the copper material is preferably 350 ppm or less by mass, for example. The lower the oxygen concentration and the higher the thermal conductivity, the less likely the specific element is oxidized. Therefore, the oxygen concentration is preferably 300 ppm or less by mass or 250 ppm or less by mass, and more preferably 200 ppm or less by mass, 150 ppm or less by mass, or 100 ppm or less by mass.

As an example of a copper material having a low oxygen concentration, oxygen-free copper having an oxygen concentration of 10 ppm or less by mass may be given. Since oxygen-free copper contains Cu at 99.96% by mass or more, it has a high theimal conductivity, and since oxygen-free copper contains a small amount of oxygen, it is possible to prevent the thermal conductivity from being decreased by the presence of oxide. Therefore, a copper material made of oxygen-free copper may be used to manufacture a composite material excellent in thermal conduction.

As another example of a copper material, tough pitch copper may be given.

The copper material may be used in various forms and sizes. For example, the copper material may be used in various forms such as powder, small pieces, plates or the like. A small piece refers to a small block that has a maximum length of 5 mm or more. As examples of a small piece, a wire rod which is cut from a wire material having a wire diameter of about 1 mm to 10 mm into a length of about 5 mm to 120 mm, a plate piece which is obtained by finely cutting a plate member having a thickness of about 1 mm to 10 mm, and the like may be given. Small pieces or plates have a smaller specific surface area than powder particles (typically having a maximum particle size of about 300 μm or less). Therefore, they are less likely to be oxidized at high temperature. As a result, the oxidation of the specific element may be inhibited, which is preferable. Particularly, the small piece has a smaller volume than the plate. Thus, the small pieces are easier to be filled in a molding die and easier to be melted, and thereby are more easily infiltrated than the plates, which is preferable. If the maximum length of the small pieces is about 15 mm to 60 mm, it is possible to obtain the effects such as inhibiting the oxidation of the specific element, easy filling and easy melting as described above. In addition, the small piece itself is easy to be prepared.

From the viewpoint of inhibiting the oxidation of the specific element, it is preferable that the copper material includes a small piece made of oxygen-free copper.

<Laminated Body>

The amount of the first powder added as the raw material of the carbon-based particles and the amount of the copper material added as the raw material of the copper phase are adjusted so that the content (see above) of the carbon-based particles and the content of the copper phase in the composite material to be manufactured reach a desired content. The amount of the second powder added as the raw material of the carbide layer is adjusted mainly according to the amount of the first powder. The specific element in the second powder reacts with C (carbon) of the carbon-based particles to form a carbide during infiltration in the second step, and is mainly present in the composite material as the carbide layer. If the addition amount of the second powder is too large, the carbide layer is likely to become thicker. Therefore, the addition amount of the second powder is adjusted so that the carbide layer is appropriately formed. In order to the carbide layer appropriately, the specific element should be present around the carbon-based particles. In the present disclosure, the second powder is added to the first powder. Since the specific element is present around the carbon-based particles, the reaction of the specific element is promoted. In particular, in the composite material manufacturing method according to the embodiment, the second powder is not simply mixed with the first powder, it is divided into two parts (not necessarily two equal parts), and then added to the first powder and the copper material. Then, the first raw material containing the first powder and the second powder, and the second raw material containing the copper material and the second powder are sequentially filled in the molding die. In the molding die, a first layer is formed of the first raw material, a second layer is formed of the second raw material, and the first layer and the second layer are laminated to form a laminated body.

In the first raw material (the first layer), the amount of the second powder added to the first powder is set to such a range that the mass ratio of the specific element relative to the total amount of C (carbon) and the specific element is 0.1% by mass or more and 15% by mass or less, for example. The mass ratio is calculated according to the following expression: [(the mass of the specific element)/(the mass of C+ the mass of the specific element)]×100. If the mass ratio is 0.1% by mass or more, the carbide layer may be appropriately formed during infiltration as described above. The larger the mass ratio is, the more reliably the carbide layer may be formed, and the better the wettability is improved. Therefore, the mass ratio is preferably 0.2% by mass or more, and more preferably 0.5% by mass or more, and 1.0% by mass or more. Depending on the infiltration conditions and the like, the mass ratio may be 5.0% by mass or more, 5.5% by mass or more, and 6.0% by mass or more. If the mass ratio is 15% by mass or less, it is possible to prevent the carbide layer from becoming thicker by the increase of the specific element. Therefore, the carbide layer is formed to have an appropriate thickness so as to inhibit the decrease in thermal conductivity due to the carbide layer. The smaller the mass ratio is, the better it is to prevent the carbide layer from becoming thicker, particularly prevent the carbide layer from becoming thicker by the solid phase reaction as described above. Therefore, the mass ratio is preferably 14% by mass or less, and more preferably 13% by mass or less, 12% by mass or less, and 10% by mass or less.

In the second raw material (the second layer), the amount of the second powder added to the copper material is set to such a range that the mass ratio of the specific element relative to the total amount of Cu and the specific element is 0.1% by mass or more and 1% by mass or less, for example. The mass ratio is calculated according to the following expression: [(the mass of the specific element)/(the mass of Cu+ the mass of the specific element)]×100. If the mass ratio is 0.1% by mass or more, the molten copper takes in the specific element, and contacts the carbon-based particles in the state of containing the specific element during infiltration so as to form a carbide containing the specific element, which makes it possible to form the carbide easily. The larger the mass ratio is, the better the molten copper takes in the specific element, and the more easily the carbide is formed. Therefore, the mass ratio is preferably 0.15% by mass or more, and more preferably 0.20% by mass or more. If the mass ratio is 1% by mass or less, it is possible to prevent the carbide layer from becoming thicker by the increase in the specific element, which makes it possible to inhibit the decrease in thermal conductivity due to the carbide layer. Note that the second powder should be included in the copper material to such an extent that the carbide may be formed at the initial stage of infiltration as described above. The smaller the mass ratio is, the better it is to prevent the carbide layer from becoming thicker. Therefore, the mass ratio is preferably 0.95% by mass or less, and more preferably 0.90% by mass or less, and 0.85% by mass or less.

The laminated body may have, for example, a two-layer structure in which the first layer is arranged as a lower layer in the gravity direction and the second layer is arranged as an upper layer in the gravity direction. Due to the own weight of copper having a large specific gravity, the molten copper may be spontaneously and easily infiltrated into the first powder. The molding die for housing the laminated body may be made of carbon. The molding die may have a high reducing property, which makes it possible to inhibit the oxidation of the molten copper and the specific element.

The first raw material may be mixed by using an appropriate mixing device and then filled in the molding die. It is preferable that the particles of the second powder are uniformly present around the carbon-based particles after mixing. On the other hand, since the difference in specific gravity between the copper material and the second powder is relatively large, it is difficult to mix them. Thus, the second raw material may be filled in such a manner that after the copper material is filled in the molding die, the second powder is filled in the gaps of the copper material, or the second powder is appropriately filled while filling the copper material. After the raw materials are filled in the molding die, the raw materials may be appropriately pressed (with a small pressure such as hand pressing) or the molding die may be tapped.

(Second Step: Infiltration Step)

In this step, the laminated body filled in the molding die is heated to melt the copper material, and the molten copper is compounded with the first powder.

The infiltration temperature (i.e., the heating temperature of the laminated body) is set higher than the melting point of Cu (1083° C.) at which the copper material may be melted. The infiltration temperature may be set to 1100° C. or higher, and 1150° C. or higher. In particular, if the infiltration temperature is set relatively high such as 1200° C. or higher, it is possible to promote the reaction between C of the carbon-based particles and the specific element of the second powder. Further, if the infiltration temperature is set high, even if the copper material is relatively large such as a small piece, the molten copper may be satisfactorily formed, which is preferable. However, if the infiltration temperature is too high, Cu contained in the copper material is likely to be oxidized in the temperature rising process before reaching the infiltration temperature. As a result, the specific element is likely to be oxidized. Therefore, the infiltration temperature is preferably 1300° C. or lower. The retention time depends on the size of the composite material and the like, and it may be 10 minutes to 3 hours, for example.

In particular, the atmosphere of the infiltration step is selected as a vacuum atmosphere of 1 Pa or less, a reducing atmosphere, or an inert atmosphere. As described above, the oxidation of Cu and the specific element may be inhibited in the vacuum atmosphere, the reducing atmosphere, or the inert atmosphere. The lower the pressure of the vacuum atmosphere is, the higher the reducibility is, and the more reliable to inhibit the oxidation. Therefore, the pressure is preferably 0.1 Pa or less, and more preferably 0.01 Pa or less. As examples of the reducing atmosphere, a hydrogen atmosphere, a mixed atmosphere of hydrogen and an inert gas such as argon or nitrogen, and the like may be given. As examples of the inert atmosphere, an inert gas such as argon or nitrogen may be given. It is preferable that the oxygen concentration is low in each atmosphere.

As described above, the molten copper takes in the specific element, and contacts the carbon-based particles in the state of containing the specific element in the infiltration step so as to form a carbide containing the specific element, and thereafter, the carbide layer is spontaneously formed, and the compounding of the carbon-based particles and the molten copper proceeds spontaneously. Therefore, it is not necessary to apply an extra pressure in the infiltration step, i.e., the infiltration step may be performed without pressurization.

After the infiltration step, the heating is stopped and the molding die is cooled to give the composite material (typically the composite material 1 of the embodiment) in which the coated particles, each of which includes a carbon-based particle covered by the carbide layer on the outer periphery, are dispersed in the copper phase. Further, since the second raw material is used, the composite material 1 (FIGS. 1 to 3) in which at least a part of the coated particles are copper-encapsulated particles containing the copper component in the carbide layer is obtained.

(Other Steps)

In addition, the composite material manufacturing method according to the embodiment may include a processing step in which cutting, grinding or the like is performed on the surface of the composite material, and a coating step in which a metal plating layer is plated on the surface after the processing step.

(Main Effects)

According to the composite material manufacturing method according to the embodiment, a composite material excellent in thermal characteristics may be manufactured for the following reasons (A) to (C), and the composite material excellent in thermal characteristics may be manufactured with high productivity for the following reasons (a) to (d).

(A) The manufactured composite material is mainly composed of the carbon-based particles and Cu.

(B) In particular, since the oxidation of the specific element is inhibited, the carbide layer containing the specific element may be appropriately formed on the surface of the carbon-based particles during infiltration, and thereby the wettability of the molten copper to the carbon-based particles is improved. Due to the improvement of the wettability, the molten copper is satisfactorily infiltrated into the carbon-based particles. Therefore, the carbon-based particles and the copper phase are adhered closely to each other via the carbide layer. Thereby, a dense composite material is manufactured with very few pores between the carbon-based particles and the copper phase. Thus, the composite material is excellent in thermal conduction since the decrease in thermal conductivity due to the pores is small.

(C) Since the oxidation of Cu and the specific element is inhibited, a composite material which contains an oxide of Cu or the specific element at a very low content may be manufactured. The composite material is excellent in thermal conduction since the decrease in thermal conductivity due to the presence of the oxide is small.

(a) A raw material containing the first powder and the second powder and a raw material containing the copper material and the second powder are filled in a molding die to manufacture the raw material for infiltration. Therefore, it is not necessary to separately prepare a powder compact of the powder mixture or a compact including a coating layer formed of a carbide that contains a specific element.

(b) Since the second powder is added to the first powder and the copper material, respectively, and the atmosphere of the infiltration step is set to a vacuum atmosphere, a reducing atmosphere or an inert atmosphere, the carbide layer may be appropriately formed without adding any auxiliary agent or the like.

(c) Since the infiltration is performed without pressurization, a dedicated equipment or the like configured to apply a high pressure is not required.

(d) Since expensive Ag is not used, the raw material cost may be lowered.

Example 1

A composite material was prepared from a first powder made of a carbon-based substance, a second powder containing various specific elements and a copper material under various infiltration conditions, and the thermal characteristics and structure thereof were investigated.

The following raw materials were prepared.

Diamond powder with an average particle size of 20 μm was prepared as the first powder.

Copper powder and small pieces were prepared as the copper material. Copper powder contains Cu at 99.8% by mass or more and inevitable impurities as the balance. The average particle size of the copper powder is 100 μm or less. The oxygen concentration of the copper powder is 240 ppm by mass. The small pieces are made of oxygen-free copper (OFC). The small pieces are obtained by cutting a wire having a diameter of 8 mm into pieces having a length of about 15 mm. The oxygen concentration in each small piece made of oxygen-free copper is 10 ppm or less by mass.

The second powder is made of a sulfide, nitride, hydride, boride of at least one element (specific element) selected from the group consisting of Si, Ti, Zr and Hf, or the specific element itself. The average particle size of the second powder is 50 μm or less.

The average particle size of the diamond powder and the copper powder is equivalent to the median particle size measured by using a commercially available particle image analyzer, Morphologi G3 (manufactured by Malvern Instruments).

The prepared raw materials were filled into a molding die (made of carbon) to form a laminated body, and the laminated body was heated for infiltration. The laminated body includes a first layer which is formed by mixing the first powder (the diamond powder) and the second powder, and a second layer which includes the copper material (the copper powder or the small pieces made of oxygen-free copper) and the second powder. The volume ratio of the first powder, the second powder and the copper material was adjusted so that the content of the carbon-based particles is about 60% by volume, the content of the copper phase is about 38% by volume, and the content of the carbide layer is about 2% by volume in the composite material to be manufactured. Moreover, the laminated body was formed by laminating the first layer as a lower layer in the gravity direction and the second layer as an upper layer in the gravity direction.

In the first layer, the amount of the second powder added to the first powder was changed, and in the second layer, the amount of the second powder added to the copper material was changed.

The mass ratio of the specific element relative to the total amount of C (carbon) and the specific element is selected from the range of 7% by mass or more and 15% by mass or less. The amount of the second powder added to the first powder was adjusted so as to satisfy the selected mass ratio of the specific element.

In addition, the mass ratio of the specific element relative to the total amount of Cu and the specific element is selected from the range of 0.2% by mass or more and 1% by mass or less. The amount of the second powder added to the copper material was adjusted so as to satisfy the selected mass ratio of the specific element.

For each sample, the material of the second powder, the mass ratio (mass %) of the specific element relative to the first powder and the copper material, and the form of the copper material are listed in Tables 1 to 3. Tables 1 and 2 show in detail the case where the specific element is Ti. When the specific element is Si, Zr or Hf, the same procedure as in the case of Ti is performed, and Table 3 only shows a part of the results. In Tables 1 to 3, the second powder is denoted as coating powder. Further, in Tables 1 to 3, the specific element is denoted as a coating element.

In the present example, the molding die was heated under a vacuum atmosphere of 1 Pa or less without pressurization to perform the infiltration. The infiltration temperature (i.e., the heating temperature of the molding die) was kept at 1200° C. or 1300° C., and the retention time was kept for 2 hours for each sample. The infiltration temperature (° C.) for each sample was listed in Tables 1 to 3. After the retention time had elapsed, the heating was stopped, and the molding die was cooled to obtain an infiltrated material. As the molding die, one that is capable of molding a cylindrical body having a diameter of 10 mm and a thickness of 10 mm was used.

The thermal conductivity (W/mK) of the obtained infiltrated material was measured. The thermal conductivity was measured by using a commercially available measuring device at room temperature (about 20° C.). The results are listed in Tables 1 to 3.

TABLE 1

| Sample No. | Material of coating powder | Carbon-based powder Coating element (mass %) | Copper material Form | Coating element (mass %) | Infiltration temperature (° C.) | Thermal conductivity (W/mK) |
|---|---|---|---|---|---|---|
| 1 | $TiS_2$ | 12 | Copper powder | 0.2 | 1300 | 208.58 |
| 2 | $TiS_2$ | 15 | Copper powder | 0.2 | 1300 | 105.94 |
| 3 | $TiS_2$ | 15 | Copper powder | 0.4 | 1300 | 150.38 |
| 4 | $TiS_2$ | 15 | Copper powder | 0.6 | 1300 | 202.57 |
| 5 | $TiS_2$ | 15 | Copper powder | 0.8 | 1300 | 175.10 |
| 6 | $TiS_2$ | 15 | Copper powder | 1 | 1300 | 148.65 |
| 7 | $TiS_2$ | 7 | Copper powder | 0.2 | 1200 | 111.02 |
| 8 | $TiS_2$ | 10 | Copper powder | 0.2 | 1200 | 224.49 |
| 9 | $TiS_2$ | 10 | Copper powder | 0.4 | 1200 | 238.14 |
| 10 | $TiS_2$ | 12 | Copper powder | 0.2 | 1200 | 200.84 |
| 11 | $TiS_2$ | 12 | Copper powder | 0.4 | 1200 | 242.30 |
| 12 | $TiS_2$ | 15 | Copper powder | 0.2 | 1200 | 140.69 |
| 13 | $TiS_2$ | 15 | Copper powder | 0.4 | 1200 | 147.07 |
| 14 | $TiS_2$ | 7 | OFC piece | 0.2 | 1200 | 334.19 |
| 15 | $TiS_2$ | 7 | OFC piece | 0.4 | 1200 | 387.53 |
| 16 | TiN | 12 | Copper powder | 0.2 | 1300 | 174.97 |
| 17 | TiN | 15 | Copper powder | 0.2 | 1300 | 108.07 |
| 18 | TiN | 15 | Copper powder | 0.4 | 1300 | 123.75 |
| 19 | TiN | 15 | Copper powder | 0.6 | 1300 | 157.28 |
| 20 | TiN | 15 | Copper powder | 0.8 | 1300 | 148.60 |
| 21 | TiN | 15 | Copper powder | 1 | 1300 | 127.83 |

TABLE 1-continued

| Sample No. | Material of coating powder | Carbon-based powder Coating element (mass %) | Copper material Form | Copper material Coating element (mass %) | Infiltration temperature (° C.) | Thermal conductivity (W/mK) |
|---|---|---|---|---|---|---|
| 22 | TiN | 7 | Copper powder | 0.2 | 1200 | 104.29 |
| 23 | TiN | 10 | Copper powder | 0.2 | 1200 | 202.97 |
| 24 | TiN | 10 | Copper powder | 0.4 | 1200 | 249.80 |
| 25 | TiN | 12 | Copper powder | 0.2 | 1200 | 170.88 |
| 26 | TiN | 12 | Copper powder | 0.4 | 1200 | 210.37 |
| 27 | TiN | 15 | Copper powder | 0.2 | 1200 | 116.93 |
| 28 | TiN | 15 | Copper powder | 0.4 | 1200 | 120.42 |
| 29 | TiN | 7 | OFC piece | 0.2 | 1200 | 320.68 |
| 30 | TiN | 7 | OFC piece | 0.4 | 1200 | 331.50 |
| 31 | $TiH_2$ | 12 | Copper powder | 0.2 | 1300 | 246.41 |
| 32 | $TiH_2$ | 15 | Copper powder | 0.2 | 1300 | 122.47 |
| 33 | $TiH_2$ | 15 | Copper powder | 0.4 | 1300 | 169.55 |
| 34 | $TiH_2$ | 15 | Copper powder | 0.6 | 1300 | 239.94 |
| 35 | $TiH_2$ | 15 | Copper powder | 0.8 | 1300 | 220.84 |
| 36 | $TiH_2$ | 15 | Copper powder | 1 | 1300 | 167.40 |
| 37 | $TiH_2$ | 7 | Copper powder | 0.2 | 1200 | 118.15 |
| 38 | $TiH_2$ | 10 | Copper powder | 0.2 | 1200 | 267.83 |
| 39 | $TiH_2$ | 10 | Copper powder | 0.4 | 1200 | 292.28 |
| 40 | $TiH_2$ | 12 | Copper powder | 0.2 | 1200 | 234.19 |
| 41 | $TiH_2$ | 12 | Copper powder | 0.4 | 1200 | 269.94 |
| 42 | $TiH_2$ | 15 | Copper powder | 0.2 | 1200 | 151.68 |
| 43 | $TiH_2$ | 15 | Copper powder | 0.4 | 1200 | 157.74 |
| 44 | $TiH_2$ | 7 | OFC piece | 0.2 | 1200 | 349.00 |
| 45 | $TiH_2$ | 7 | OFC piece | 0.4 | 1200 | 397.74 |

TABLE 2

| Sample No. | Material of coating powder | Carbon-based powder Coating element (mass %) | Copper material Form | Copper material Coating element (mass %) | Infiltration temperature (° C.) | Thermal conductivity (W/mK) |
|---|---|---|---|---|---|---|
| 46 | $TiB_2$ | 12 | Copper powder | 0.2 | 1300 | 241.10 |
| 47 | $TiB_2$ | 15 | Copper powder | 0.2 | 1300 | 125.49 |
| 48 | $TiB_2$ | 15 | Copper powder | 0.4 | 1300 | 165.18 |
| 49 | $TiB_2$ | 15 | Copper powder | 0.6 | 1300 | 240.02 |
| 50 | $TiB_2$ | 15 | Copper powder | 0.8 | 1300 | 218.73 |
| 51 | $TiB_2$ | 15 | Copper powder | 1 | 1300 | 162.04 |
| 52 | $TiB_2$ | 7 | Copper powder | 0.2 | 1200 | 114.16 |
| 53 | $TiB_2$ | 10 | Copper powder | 0.2 | 1200 | 269.89 |
| 54 | $TiB_2$ | 10 | Copper powder | 0.4 | 1200 | 297.44 |
| 55 | $TiB_2$ | 12 | Copper powder | 0.2 | 1200 | 238.37 |
| 56 | $TiB_2$ | 12 | Copper powder | 0.4 | 1200 | 275.05 |
| 57 | $TiB_2$ | 15 | Copper powder | 0.2 | 1200 | 153.58 |
| 58 | $TiB_2$ | 15 | Copper powder | 0.4 | 1200 | 157.24 |
| 59 | $TiB_2$ | 7 | OFC piece | 0.2 | 1200 | 359.07 |
| 60 | $TiB_2$ | 7 | OFC piece | 0.4 | 1200 | 407.19 |
| 61 | Ti | 12 | Copper powder | 0.2 | 1300 | 171.19 |
| 62 | Ti | 15 | Copper powder | 0.2 | 1300 | 97.04 |
| 63 | Ti | 15 | Copper powder | 0.4 | 1300 | 130.81 |
| 64 | Ti | 15 | Copper powder | 0.6 | 1300 | 155.02 |
| 65 | Ti | 15 | Copper powder | 0.8 | 1300 | 152.10 |
| 66 | Ti | 15 | Copper powder | 1 | 1300 | 124.55 |
| 67 | Ti | 7 | Copper powder | 0.2 | 1200 | 102.53 |
| 68 | Ti | 10 | Copper powder | 0.2 | 1200 | 188.36 |
| 69 | Ti | 10 | Copper powder | 0.4 | 1200 | 202.76 |
| 70 | Ti | 12 | Copper powder | 0.2 | 1200 | 164.80 |
| 71 | Ti | 12 | Copper powder | 0.4 | 1200 | 204.51 |
| 72 | Ti | 15 | Copper powder | 0.2 | 1200 | 114.60 |
| 73 | Ti | 15 | Copper powder | 0.4 | 1200 | 116.47 |
| 74 | Ti | 7 | OFC piece | 0.2 | 1200 | 248.09 |
| 75 | Ti | 7 | OFC piece | 0.4 | 1200 | 287.92 |

TABLE 3

| Sample No. | Material of coating powder | Carbon-based powder Coating element (mass %) | Copper material Form | Copper material Coating element (mass %) | Infiltration temperature (° C.) | Thermal conductivity (W/mK) |
|---|---|---|---|---|---|---|
| 76 | Si | 10 | Copper powder | 0.4 | 1200 | 209.51 |
| 77 | ZrS$_2$ | 10 | Copper powder | 0.4 | 1200 | 214.08 |
| 78 | HfB$_2$ | 10 | Copper powder | 0.4 | 1200 | 237.80 |

As illustrated in Tables 1 to 3, even if pure copper is used instead of Ag, a composite material which is excellent in thermal conduction and has an excellent thermal conductivity of 170 W/mK or more, and particularly 200 W/mK or more may be obtained (sample No. 1, 4, 8-11, 14, 15, 23, 24, 26, 29-31, 34, 35, 38-41, 44-46, 49, 50, 53-56, 59, 60, 69, 71, 74 to 78 (hereinafter will be collectively referred to as sample group No. 1)). In the present example, many composite materials having a thermal conductivity of 220 W/mK or more were obtained, and some (sample No. 45 and 60) even have a thermal conductivity of about 400 W/mK. From the present example, it is obvious that such a high thermal conductivity composite material (such as sample group No. 1) may be manufactured by adding the second powder to the first powder and the copper material, respectively, and performing the infiltration in a vacuum atmosphere. Furthermore, from the present example, it is considered that the thermal conductivity may be further improved by adjusting the size and the content of the first powder, the form of the copper material, the addition amount of the second powder (the mass ratio of the specific element), the infiltration temperature and the like. For example, it is expected that a composite material having a higher thermal conductivity may be obtained by increasing the size or the content of the first powder.

Hereinafter, the infiltrated materials in sample group No. 1 having a thermal conductivity of 200 W/mK or more will be discussed.

The linear expansion coefficient ($\times 10^{-6}$/K) of each infiltrated material in sample group No. 1 was measured, and the linear expansion coefficient of each sample was in the range of $5\times10^{-6}$/K to $13\times10^{-6}$/K. Since each infiltrated material in sample group No. 1 has a high thermal conductivity and a linear expansion coefficient close to that of the semiconductor device and its peripheral components, it is expected that it may be suitably used as a material for a heat dissipation member of the semiconductor device. The linear expansion coefficient was measured by using a commercially available measuring device in a temperature range of 30° C. to 800° C.

The reason why each infiltrated material in sample group No. 1 is excellent in thermal conduction will be discussed.

One reason may be that each infiltrated material contains diamond with a high thermal conductivity and pure copper. In the present Example, sample No. 14, 15, 29, 30, 44, 45, 59, 60, 74 and 75 made of a small piece of oxygen-free copper as a raw material have a particularly high thermal conductivity of about 250 W/mK or more, and many samples even have a thermal conductivity of 300 W/mK or more. From this result, it is possible to obtain a composite material excellent in thermal conduction by using a copper material made of pure copper having a low oxygen concentration such as oxygen-free copper or a copper material having a large specific surface area such as small pieces as the raw material.

Another reason may be that each infiltrated material is dense. As illustrated in FIGS. 2 and 3, a cross section of each infiltrated material in sample group No. 1 was taken and observed with an SEM, it was found that in each sample, the coated particles 4, each of which includes the carbide layer 3 that covers at least a part (in the present example, substantially all) of the surface of the carbon-based particle 2, are dispersed in the copper phase 5. Further, it was found that in each sample, the carbon-based particles 2 and the copper phase 5 are adhered closely to each other via the carbide layer 3 with no gaps, and the number of pores is small. FIGS. 2 and 3 illustrate the infiltrated material of sample No. 45. The relative density of each infiltrated material in sample group No. 1 is 80% or more.

For each infiltrated material of sample group No. 1, the average particle size of the carbon-based particles was measured, and it was found that the average particle size of each sample was 17 μm, which is approximately equal to the average particle size of the first powder used as the raw material. From this result, it is considered that the thermal conduction may be improved if the average particle size is not too small so as to reduce the grain boundaries. The average particle size was measured by using the cross-sectional SEM image as described above. In the cross-sectional SEM image, the diameter of an equivalent circle for each of 10 or more carbon-based particles is measured. The average value of the obtained diameters is defined as the average particle size. A publicly known image software (Image J) was used for the measurement.

The content of the carbon-based particles in each infiltrated material in sample group No. 1 was determined, and it was found that the content was about 55% by volume in each sample, which was approximately equal to the amount of the first powder used as the raw material. It is considered that the thermal conduction may be improved by containing the carbon-based particles having a high thermal conductivity in an appropriate amount. The content was measured by using the cross-sectional SEM image as described above. In the cross-sectional SEM image, all the carbon-based particles in the measurement region of 80 μm×120 μm are extracted, and the total area thereof is determined. The ratio of the total area of the carbon-based particles relative to the area of the measurement region is calculated. This area ratio was regarded as the volume ratio. A publicly known image software (Image J) was used for the measurement.

The maximum thickness and the average thickness of the carbide layer were determined for sample No. 45 in sample group No. 1. In the present example, the maximum thickness of the carbide layer for each of 10 or more coated particles was determined in the following manner. As described above, in the cross-sectional SEM image, the circumscribed circle is taken for each carbon-based particle, 60 diameters are drawn (see also FIG. 2B). The length of the line segment that crosses the carbide layer as a straight line or an extension line along the diameter is determined. Of the determined line segments, the lengths of the top 5 longer line segments are averaged. The average value of the lengths of the top 5 longer line segments is defined as the maximum thickness of each coated particle. The maximum thickness of each coated particle has a minimum value of 0.19 µm and a maximum value of 1.46 µm. The average values (maximum thickness) for 10 or more coated particles are averaged, and the average value is defined as the maximum thickness for sample No. 45. The maximum thickness is 3 µm or less, and in the present example, it is 2 µm or less.

For 10 or more coated particles, the average thickness of the carbide layer of each coated particle was determined. As described above, the lengths of 60 line segments are determined and averaged in the same manner for each coated particle. The average value is defined as the average thickness of each coated particle. The average thickness of each coated particle has a minimum value of 0.04 µm and a maximum value of 0.23 µm. The average values (average thickness) for 10 or more coated particles are averaged, and the average value is defined as the average thickness for sample No. 45. The average thickness is less than 0.50 µm, and in the present example, it is 0.30 µm or less.

In the infiltrated materials of sample group No. 1, it is considered that the maximum thickness and the average thickness of the carbide layer in each sample other than sample No. 45 are equivalent to those of sample No. 45. Thus, it is considered that the thermal conduction may be improved if the carbide layer, which is lower in thermal conductivity than the carbon-based particles and the copper phase, is not too thick. Also, it is considered that the thermal conduction may be improved if the carbide layer was present in an appropriate thickness, which improves the wettability of the molten copper to the carbon-based particles during the manufacturing process, contributing to densification.

As illustrated in FIGS. 2A and 3, in each infiltrated material of sample group No. 1, a large number of coated particles (copper-encapsulated particles) including a carbide layer having a portion encapsulating a copper component were present. It is considered that the thermal conduction may be improved if the copper component is contained in the carbide layer having a lower thermal conductivity. Further, as illustrated in FIGS. 2A and 3, although the copper encapsulated portion 40 of the copper component 50 is locally thick, it is considered that the thermal conduction may be improved if the maximum thickness of the carbide layer 3 including the copper encapsulated portion 40 is as thin as 3 µm or less as described above.

In addition, in the present example, the carbide layer 3 containing the copper-encapsulated particles has a plurality of copper encapsulated portions 40 that are spaced apart in the circumferential direction, and some are locally thick. However, among the 60 line segments used for measuring the thickness of the carbide layer 3 as described above, the number of the adjacent line segments that cross each copper encapsulated portion 40 and have a length of 1 µm or more is 5 or less. Therefore, although the carbide layer 3 has a locally thick portion of 1 µm or more, the length of each thick portion along the circumferential direction of the carbon-based particle is relatively short. Furthermore, among the 5 or less adjacent line segments crossing each copper encapsulated portion 40, the region sandwiched by 2 line segments that are the most distant in the circumferential direction of each copper-encapsulated particle is taken as the thick portion. The cross-sectional area (the total cross-sectional area including the carbide containing the specific element and the copper component 50) of each thick portion was determined, and the sum of the cross-sectional area was calculated, it was found that the total cross-sectional area is 30 µm$^2$ or less. Therefore, although the carbide layer 3 has thick portions locally, it may be said that the total cross-sectional area thereof is small. Thereby, it is considered that the thermal conduction was improved. Further, since the composite material contains the carbide containing the specific element and the copper component 50, it is considered that the wettability and density are enhanced, which improves the thermal conduction.

The total content of the copper components in the carbide layer of the copper-encapsulated particles was examined for sample No. 45 in sample group No. 1, and it was found that the total content was 1% by volume to 20% by volume. In addition, the ratio of the total cross-sectional area of the copper-encapsulated particles relative to the total cross-sectional area of the coated particles was examined for sample No. 45, and it was found that the ratio was 50% or more. In the infiltrated materials of sample group No. 1, it is considered that the cross-sectional area ratio of the copper-encapsulated particles in each sample other than sample No. 45 is equivalent to that of sample No. 45. Thus, it is considered that the thermal conduction may be further improved by containing an appropriate amount of the copper-coated particles (the portion 40 that encapsulates the copper component 50).

The total content of the copper component was measured by using the cross-sectional SEM image. All of the copper-encapsulated particles present in a measurement region of 30 µm×40 µm in the cross-sectional SEM image are extracted. For each of the extracted copper-encapsulated particles, the area ratio of the copper component is calculated as [(the total area of the copper component)/(the area of the carbide layer of copper-encapsulated particles)]×100. The area of the carbide layer is the total area of the compound containing the specific element and the copper component. The area ratio of the copper component is calculated for all the extracted copper-encapsulated particles, and is averaged. The average value is defined as the area ratio of the copper component and is regarded as the volume ratio. In the present example, among all of the copper-encapsulated particles, those particles in which the total content of the copper component satisfies 1% or more by volume and 70% or less by volume are extracted, and the cross-sectional area ratio of the copper-encapsulated particles is calculated as [(the total area of the extracted copper-encapsulated particles)/(the total area of the coated particles)]×100. A publicly known image software (Image J) was used for the measurement.

The content of the specific element in the copper phase was determined for each infiltrated material in sample group No. 1. The content of the specific element was determined from the cross-sectional SEM image by using a commercially available silicon drift detector (OCTANE SUPERE manufactured by EDAX), and the specific element was not detected in any of the sample. From the result, it can be said that the content of the specific element in the copper phase is 1% by mass or less, which is the quantification limit of the detector. Thus, it is considered that the thermal conduction may be improved if the specific element lower in thermal conductivity than Cu is substantially not contained in the copper phase. Also, from the result, it is considered that the specific element of the second powder added to the copper material was utilized to form the carbide layer.

The surface shape of the carbon-based particles in each infiltrated material of sample group No. 1 was examined, and as illustrated in the upper part of the SEM image in FIG. 2, it was found that the surface of the carbon-based particle in the coated particle was very rough. Therefore, the contour length $L_2$ of the carbon-based particle and the circumferential length $L_0$ of the equivalent circle of the carbon-based particle were determined from the cross-sectional SEM image, and the degree of irregularity was calculated as $L_2/L_0$. In the present example, the degree of irregularity was calculated for 10 or more carbon-based particles, and the average value thereof was obtained. As a result, the average value is 1.35 to 1.59. The degree of irregularity for each sample satisfies 1.2 or more. Thus, each of the infiltrated materials in sample group No. 1 has high interfacial strength between the carbon-based particles, the carbide layer and the copper phase, and is expected to be excellent in thermal cycle characteristics. A publicly known image software (Image J) was used for the measurement.

The oxygen content of sample No. 45 in sample group No. 1 was examined, and it was found that the oxygen content was 0.03% by mass, which was extremely low. In the infiltrated materials of sample group No. 1, it is considered that the oxygen content of each sample other than sample No. 45 is equivalent to that of sample No. 45. From this result, it can be said that the infiltrated material contains a small amount of oxide, and it is considered that the thermal conduction is improved since the decrease in thermal conductivity due to the oxide is inhibited. The oxygen content may be measured by using a commercially available oxygen analyzer. In the present example, the oxygen content was measured by using ON836 (manufactured by LECO).

Next, the conditions for manufacturing a composite material excellent in thermal conduction such as the infiltrated material in sample group No. 1 will be discussed.

After an argon atmosphere was used instead of the vacuum atmosphere, the amount of the second powder added to the first powder (the mass ratio of the specific element) was set to 2% by mass and the amount of the second powder added to the copper material (the mass ratio of the specific element) was set to 0.1% by mass, the infiltration was performed at 1100° C. for 2 hours, and it was found the infiltration did not occur substantially. One reason may be that the addition amount of the second powder was small. From this result, it is considered that it is preferable to adjust the addition amount of the second powder and the infiltration temperature in accordance with the atmosphere.

As listed in Tables 1 to 3, even if the infiltration temperature is the same, the thermal conductivity is different if the amount of the second powder added to the first powder and the amount of the second powder added to the copper material are different. For example, when a copper material having a relatively high oxygen content such as copper powder is used and the infiltration temperature is set to 1300° C., if the amount of the second powder added to the first powder (the mass ratio of the specific element) is 15% by mass, it can be said that the amount of the second powder added to the copper material (the mass ratio of the specific element) is preferably more than 0.4% by mass and less than 1% by mass (for example, see the comparison between sample No. 34 and 35 and sample No. 32, 33 and 36). Further, when the infiltration temperature is set to 1300° C. and the amount of the second powder added to the first powder (the mass ratio of the specific element) is 12% by mass, if the amount of the second powder added to the copper material (the mass ratio of the specific element) is 0.2% by mass, the thermal conductivity is 170 W/mK or more (see sample No. 1, 16, 31, 46 and 61). From this result, the addition amount of the second powder may be further lowered.

Alternatively, for example, when a copper material having a relatively high oxygen content such as copper powder is used and the infiltration temperature is set to 1200° C., it can be said that the amount of the second powder added to the first powder (the mass ratio of the specific element) is preferably 10% by mass or more, and the amount of the second powder added to the copper material (the mass ratio of the specific element) is preferably 0.2% by mass or more and 0.4% by mass or less (see for example sample No. 8 to 11, 23 to 26, 38 to 41, 53 to 56, 68, 69, 71 and 76 to 78, each of which has a thermal conductivity of 170 W/mK).

Alternatively, for example, when a copper material having a relatively low oxygen content such as a small piece of OFC is used and the infiltration temperature is set to 1200° C., it can be said that the amount of the second powder added to the first powder (the mass ratio of the specific element) is preferably less than 10% by mass, and particularly 7% by mass in the present example, and the amount of the second powder added to the copper material (the mass ratio of the specific element) is preferably 0.2% by mass or more and 0.4% by mass or less (see sample No. 14, 15, 29, 30, 44, 45, 59, 60, 74 and 75). In this case, it can be said that when the amount of the second powder added to the copper material is increased, the relative density is improved, which makes the composite material denser. For example, compared with sample No. 44, it is considered that sample No. 45 which has a higher thermal conductivity is denser.

In conclusion, depending on the size of the carbon-based particles, the infiltration temperature, the material of the second powder and the like, if the amount of the second powder added to the first powder (the mass ratio of the specific element) is adjusted in the range of 1% by mass or more and 15% by mass or less, and the amount of the second powder added to the copper material (the mass ratio of the specific element) is adjusted in the range of 0.1% by mass or more and 1% by mass or less, it is possible to obtain a composite material excellent in thermal conduction. Further, a composite material excellent in thermal conduction may be obtained if a copper material having a relatively small oxygen content and a large specific surface area such as a small piece of OFC is used.

The present invention is not limited to those described in the above, it is defined by the scope of the claims, and encompasses all modifications equivalent in meaning and scope to the claims.

For example, in the Example 1 mentioned above, at least one requirement may be changed in at least one of the following items:
(1) type of the carbon-based substance;
(2) average particle size, content or the like of the first powder;
(3) shape, size, oxygen concentration or the like of the copper material;
(4) type, form, addition amount or the like of the second powder for forming the carbide layer;
(5) infiltration conditions (infiltration temperature, retention time, atmosphere or the like); and
(6) shape, size or the like of the infiltrated material

REFERENCE SIGNS LIST

1: composite material
2: carbon-based particle
3: carbide layer
4: coated particle
40: copper encapsulated portion
5: copper phase
50: copper component

The invention claimed is:

1. A composite material manufacturing method comprising:
   a step of forming a laminated body by laminating a first layer and a second layer; and
   a step of heating the laminated body, wherein
   the first layer including:
      a first powder made of a carbon-based substance; and
      a second powder made of at least one of a compound containing at least one element selected from the group consisting of Si, Ti, Zr, and Hf, and an element itself selected from the group consisting of Si and Hf, wherein the first layer is formed by mixing the first powder and the second powder, and wherein when second powder is made of the compound containing the at least one element selected from the group consisting of Ti and Zr, the compound containing the at least one element selected from the group consisting of Ti and Zr is a sulfide, a nitride, a hydride, or a boride,
   the second layer including:
      a copper material consisting of Cu and inevitable impurities; and
      the second powder,
   in the heating step, the copper material being heated to a molten state under a vacuum atmosphere of 1 Pa or less, a reducing atmosphere or an inert atmosphere without pressurization, and compounded with the first powder,
   wherein first layer containing the first powder and the second powder, and the second layer containing the copper material and the second powder are sequentially filled in a molding die.

2. The composite material manufacturing method according to claim 1, wherein
   in the step of forming the laminated body, the amount of the second powder added to the first powder is set to such a range that the mass ratio of the element relative to the total amount of C and the element is 0.1% by mass or more and 15% by mass or less, and
   the amount of the second powder added to the copper material is set to such a range that the mass ratio of the element relative to the total amount of Cu and the element is 0.1% by mass or more and 1% by mass or less.

3. The composite material manufacturing method according to claim 1, wherein
   the copper material includes a small piece made of oxygen-free copper having an oxygen concentration of 10 ppm or less by mass.

4. The composite material manufacturing method according to claim 1, wherein
   the second powder is added to the first powder.

5. The composite material manufacturing method according to claim 1, wherein
   the second powder is made of the compound containing the at least one element selected from the group consisting of Si, Ti, Zr, and Hf.

6. The composite material manufacturing method according to claim 5, wherein
   wherein when second powder is made of the compound containing the at least one element selected from the group consisting of Si, Ti, Zr, and Hf, the compound containing the at least one element selected from the group consisting of Si, Ti, Zr, and Hf is a sulfide, a nitride, a hydride, or a boride.

* * * * *